(12) United States Patent (10) Patent No.: US 9,223,692 B2
Kwak (45) Date of Patent: Dec. 29, 2015

(54) NONVOLATILE MEMORY DEVICE WITH MULTI-LEVEL MEMORY CELLS AND PROGRAMMING METHOD

(71) Applicant: Donghun Kwak, Hwaseong-si (KR)

(72) Inventor: Donghun Kwak, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 284 days.

(21) Appl. No.: 13/707,648

(22) Filed: Dec. 7, 2012

(65) Prior Publication Data

US 2014/0047163 A1 Feb. 13, 2014

(30) Foreign Application Priority Data

Aug. 8, 2012 (KR) .................. 10-2012-0086805

(51) Int. Cl.
*G06F 12/02* (2006.01)
*G06F 12/00* (2006.01)
*G06F 13/00* (2006.01)
*G06F 13/28* (2006.01)
*G11C 16/00* (2006.01)

(52) U.S. Cl.
CPC ............ *G06F 12/0246* (2013.01); *G06F 12/02* (2013.01); *G11C 16/00* (2013.01); *G06F 12/0207* (2013.01)

(58) Field of Classification Search
CPC .............................. G06F 12/02; G06F 12/0246
USPC ........... 711/173, 117, 103, E12.008, E12.001
See application file for complete search history.

(56) References Cited

U.S. PATENT DOCUMENTS

| 7,554,859 | B2 | 6/2009 | Choi |
| 7,864,572 | B2 | 1/2011 | Yeh et al. |
| 7,865,658 | B2 | 1/2011 | Lasser et al. |
| 2008/0175065 | A1 | 7/2008 | Choi et al. |
| 2010/0157675 | A1 | 6/2010 | Shalvi et al. |
| 2011/0013458 | A1 | 1/2011 | Seol |
| 2011/0252187 | A1* | 10/2011 | Segal et al. .................. 711/103 |
| 2011/0292725 | A1 | 12/2011 | Choi et al. |
| 2012/0173800 | A1* | 7/2012 | Yoon et al. .................. 711/103 |
| 2013/0176781 | A1* | 7/2013 | Hung ..................... 365/185.05 |

FOREIGN PATENT DOCUMENTS

| JP | 2011-253609 A | 12/2011 |
| KR | 10-2008-0027419 A | 3/2008 |
| KR | 10-2011-0008556 A | 1/2011 |
| KR | 1020110094640 A | 8/2011 |

* cited by examiner

*Primary Examiner* — Sanjiv Shah
*Assistant Examiner* — Shane Woolwine
(74) *Attorney, Agent, or Firm* — Volentine & Whitt, PLLC

(57) ABSTRACT

A non-volatile memory (NVM) includes a memory cell array of multi-level memory cells (MLC) arranged in physical pages. A programming method for the NVM includes; receiving first data and partitioning the first data according to a single bit page capacity of a physical page to generate partitioned first data, programming the partitioned first data as single-bit data to a plurality of physical pages, and receiving second data and programming the second data as multi-bit data to a selected physical page among the plurality of physical pages, wherein the second data is simultaneously programmed to the MLC of the selected physical page.

23 Claims, 21 Drawing Sheets

NONVOLATILE MEMORY DEVICE WITH MULTI-LEVEL MEMORY CELLS AND PROGRAMMING METHOD

CROSS-REFERENCE TO RELATED APPLICATIONS

A claim of priority is made under 35 U.S.C. §119 to Korean Patent Application No. 10-2012-0086805 filed Aug. 8, 2012, the subject matter of which is hereby incorporated by reference.

BACKGROUND

The inventive concept relates to semiconductor memory devices and methods of programming same. More particularly, the inventive concept relates to semiconductor memory devices incorporating multi-level, nonvolatile memory cells and programming methods for same. In certain embodiments, the inventive concept relates to semiconductor memory devices having three-dimensional (3D) memory cell arrays of nonvolatile memory cells and programming methods for same.

Semiconductor memory devices may be generally classified as volatile or nonvolatile according to their operative nature. Volatile memory devices lose stored data in the absence of applied power, while nonvolatile memory devices are able to retain stored data even when power is no longer applied.

There are different kinds of nonvolatile memory devices, including for example, the mask read-only memory (MROM), programmable read-only memory (PROM), erasable programmable read-only memory (EPROM), and electrically erasable programmable read-only memory (EEPROM).

Flash memory is a particular type of EEPROM that has been adopted for use in a great variety of digital systems, such as computers, cellular phones, PDAs, digital cameras, camcorders, voice recorders, MP3 players, handheld PCs, games, facsimiles, scanners, printers, and the like. One factor recommending the wide spread use of flash memory in contemporary electronic devices is its high data density. Data density may be understood as the number of digital data bits capable of being stored per unit area occupied by a memory device, or memory system.

Recent attempts to further increase the data density of nonvolatile memory devices such as flash memory devices have resulted in the development and use of multi-level (or multi-bit) memory cells (MLC) along with related programming techniques. The term "multi-level memory cell(s)" or "MLC" has been used to generally denote a class of nonvolatile memory cells capable of storing more than one bit of binary data. In contrast, "single-level memory cells" or "SLC" are intended to store only a single bit of binary data (e.g., a "1" or "0"). In most applications, the distinction between MLC or SLC in relation to a memory cell (or group of memory cells) has more to do with the particular programming, erase, and/or read techniques applied to the memory cells, rather than the physical or material structure of the memory cell(s). Nonetheless, the provision of nonvolatile memory cell arrays with MLC rather than SLC has resulted in dramatic increases in overall data density.

Other recent attempts to further increase the data density of nonvolatile memory devices such as flash memory devices, have resulted in the development of the three-dimension (3D) memory cell arrays. Historically, memory cell arrays have been implemented in planer (2D) arrangements of memory cells.

SUMMARY

Embodiments of the inventive concept variously provide memory devices, memory systems, controllers, and nonvolatile memory programming methods that allow data to be efficiently stored in multi-level, nonvolatile memory cells to provide enhanced data density. Certain embodiments of the inventive concept make efficient used of the data storage capacity provided by odd-bit multi-level memory cells even though host data may be provided in $2^N$ sizes. Certain embodiments of the inventive concept reduce the number of housekeeping operations (e.g., garbage collection operations) that must be performed by a nonvolatile memory device including multi-level memory cells. Certain embodiments of the inventive concept may be advantageously applied to nonvolatile memory devices including three-dimensional memory cell arrays.

In one embodiment, the inventive concept provides a programming method for a non-volatile memory including a memory cell array of multi-level memory cells (MLC) arranged in physical pages, wherein each MLC stores up to N bits of data, "N" being an integer greater than two, and the method comprising; receiving first data and partitioning the first data according to a single bit page capacity of a physical page to generate partitioned first data, programming the partitioned first data as single-bit data to a plurality of physical pages, and receiving second data and programming the second data as multi-bit data to a selected physical page among the plurality of physical pages, wherein the second data is simultaneously programmed to the MLC of the selected physical page.

In another embodiment, the inventive concept provides a data management method for a memory system including a non-volatile memory having a memory cell array of multi-level memory cells (MLC) arranged in physical pages, wherein each MLC stores up to N bits of data, each physical page is defined by a single-bit page capacity (1bPC), a total-bit page capacity (TbPC) equal to (N×1PC), and a remainder-bit page capacity (RbPC) equal to (TbPC−1bPC), the method comprising; executing a first programming operation storing X bits of first data by—determining a number Q of first selected physical pages necessary to store the first data as single bit data in the first selected physical pages, where Q=[(X÷1bPC)+1 for any remainder], partitioning the first data by Q to generate partitioned first data, and programming the partitioned first data as single-bit data to the first selected physical pages; and executing a second programming operation storing Y bits of second data after executing the first programming operation by—determining a number R of second selected physical pages among the first selected physical pages necessary to store the second data as (N−1) multi-bit data in the second selected physical pages, where R=[(Y÷RbPC)+1 for any remainder], dividing the second data by R to generate divided second data, and programming the divided second data as (N−1) multi-bit data to the second selected physical pages, wherein the divided second data is simultaneously programmed to MLC of the second selected physical pages, where "N" is an integer greater than 2, "Q" is an integer greater than 1, and each one of "X", "Y", and "R" is a positive integer.

In another embodiment, the inventive concept provides a data management method for a non-volatile memory including a memory cell array of multi-level memory cells (MLC)

arranged in physical pages, the method comprising; during a first programming operation, receiving first data and partitioning the first data according to a single bit page capacity of a physical page to generate partitioned first data, and programming the partitioned first data as single-bit data to only a first logical page of the MLC in selected physical pages, and during a second programming operation after the first programming operation, receiving second data and simultaneously programming the second data as multi-bit data to second and third logical pages of the MLC in at least one of the selected physical pages.

In another embodiment, the inventive concept provides a memory system comprising; a non-volatile memory comprising a memory cell array of multi-level memory cells (MLC) arranged in physical pages, each MLC storing up to N bits of data, a controller configured during a first programming operation to receive first data from a host, partition the first data according to a single bit page capacity of a physical page to generate partitioned first data, and program the partitioned first data as single bit data to first selected physical pages, the controller being further configured during a second programming operation to receive second data from the host, and program the second data as multi-bit data to a second selected physical page among the first selected physical pages, wherein the multi-bit data is simultaneously programmed to the MLC of the second selected physical page.

In another embodiment, the inventive concept provides a controller for a memory system including a non-volatile memory including a memory cell array of multi-level memory cells (MLC) arranged in physical pages, the controller being configured during a first programming operation to receive first data from a host, partition the first data according to a single bit page capacity of a physical page to generate partitioned first data, and program the partitioned first data as single bit data to first selected physical pages, and during a second programming operation to receive second data from the host, and program the second data as multi-bit data to a second selected physical page among the first selected physical pages, wherein the multi-bit data is simultaneously programmed to the MLC of the second selected physical page.

In another embodiment, the inventive concept a memory system comprising; a non-volatile memory comprising a three-dimensional (3D) memory cell array of multi-level memory cells (MLC) arranged in physical pages, each MLC storing up to N bits of data and the 3D memory cells array comprising a plurality of cells strings, each cell string extending in a first direction, a plurality of word line extending in a second direction, and a plurality of bit lines extending in a third direction, wherein each cell string is connected to one of the plurality of bit lines and comprises a plurality of MLC series connected between a string selection transistor (SST) and a ground selection transistor (GST), each one of the plurality of plurality of MLC being respectively controlled by one of the plurality of word lines, each SST being controlled by a string selection line, and each GST being controlled by a ground selection line, a controller configured during a first programming operation to receive first data from a host, partition the first data according to a single bit page capacity of a physical page to generate partitioned first data, and program the partitioned first data as single bit data to first selected physical pages, the controller being further configured during a second programming operation to receive second data from the host, and program the second data as multi-bit data to a second selected physical page among the first selected physical pages, wherein the multi-bit data is simultaneously programmed to the MLC of the second selected physical page.

BRIEF DESCRIPTION OF THE DRAWINGS

Certain embodiments of the inventive concept are described hereafter with reference to the accompanying drawings.

DETAILED DESCRIPTION OF EMBODIMENTS

Figure 1:
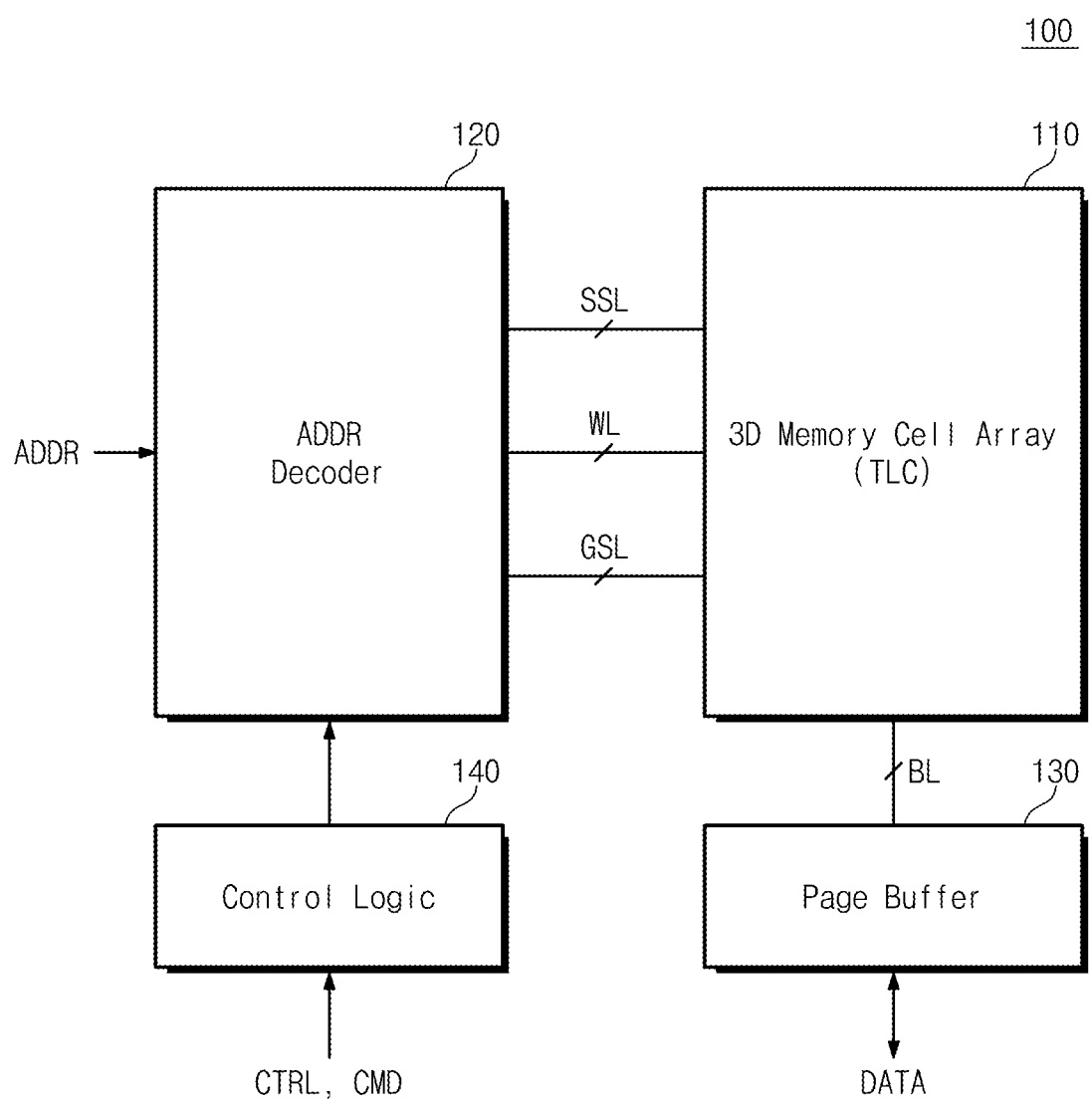
FIG. 1 is a block diagram illustrating a nonvolatile memory device according to an embodiment of the inventive concept.

Certain embodiments of the inventive concept will now be described in some additional detail with reference to the accompanying drawings. The inventive concept may, however, be embodied in many different forms, and should not be construed as being limited to only the illustrated embodiments. Rather, these embodiments are provided as examples so that this disclosure will be thorough and complete, and will fully convey the concept of the inventive concept to those skilled in the art. Accordingly, conventional understood processes, elements, and techniques may not be described in detail with respect to some of the illustrated embodiments. Unless otherwise noted, like reference numbers and labels are used to denote like or similar elements throughout the drawings and written description.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a nonvolatile memory device according to an embodiment of the inventive concept. Referring to FIG. 1, a nonvolatile memory device 100 comprises a memory cell array 110, an address decoder 120, a page buffer 130, and control logic 140. In certain embodiments of the inventive concept, the memory cell array 110 may be implemented as a 3D memory cell array.

The memory cell array 110 is connected to the address decoder 120 via word lines WL, string selection lines SSL, and ground selection lines GSL. The memory cell array 110 is also connected to the page buffer 130 via bit lines BL.

Assuming the provision of a 3D memory cell array in certain embodiments, the memory cell array 110 may be arranged according to a plurality of memory blocks (BLKs), where each memory block includes memory cells arranged in a defined row direction, a defined column direction, and a direction perpendicular to a substrate. These three "directions" may be arbitrarily defined, but will be substantially orthogonal, each one to the others, in order to define the structure of a 3D memory cell array. In certain embodiment of the memory cell array 110, cell strings may be formed in a direction perpendicular to the substrate.

Within this configuration, memory cells of the memory cell array 110 may be selected by a corresponding string selection line SSL.

In the embodiments that follow, it is assumed that the memory cells of a memory cell array according to an embodiment of the inventive concept are multi-level memory cells (MLC) capable of storing two or more bits of data. That is, it is assumed that each memory cell is conditioned, programmed, erased and read using techniques that enable two or more bits of data to be coherently stored by and retrieved from a single MLC. In certain embodiments, each memory cell may be a charge trap flash (CTF) memory cell capable of storing two or more data states according to two or more corresponding threshold voltage distributions respectively associated with an amount of charge placed on a CTF memory cell. In other embodiments, each memory cell may be a phase-change memory cell wherein two or more data states are indicated by different material phases, a magnetic memory cell wherein two or more data states are indicated by different magnetic properties, a resistive memory cell wherein two or more data states are indicated by different resistance values, or a ferroelectric memory cell wherein two or more data states are indicated by different material properties.

The address decoder 120 operates under the control of the control logic 140. In general operation, the address decoder 120 receives an externally provided address (ADDR) in addition to control signals from the control logic 140, and in response, provides certain control voltages to the memory cell array 110. For example, depending on the particular operation (e.g., program, read, or erase) being executed, the address decoder 120 will provide of the word line voltages, string selection line voltages, and/or ground selection line voltages to the memory cell array 110 in accordance with a decoded row address.

Additionally, the address decoder 120 may decode a column address provided as part of the received address and transfer the decoded column address to the page buffer 130. Thus, in the illustrated embodiment of FIG. 1, it is assumed that the address decoder 120 includes constituent (and conventionally understood) elements sufficient to form a row decoder, a column decoder, an address buffer, and related circuitry.

In similar manner, the page buffer 130 operates under the control of the control logic 140. In general operation, the page buffer 130 selects a bit line BL from among the plurality of bit lines in response to the decoded column address received from the address decoder 120.

During certain operations, the page buffer 130 receives externally provided data (DATA) to be programmed to memory cell array 110. During other operations, the page buffer 130 receives read data from the memory cell array 110 to be output to an external device. During still other operations consistent with embodiments of the inventive concept, the page buffer 130 may and store (latch) read data from one area of the memory cell array 110 before programming said data to another area of the memory cell array 110.

As will be conventionally appreciated, the page buffer 130 may include a plurality of page buffer units. The page buffer units may be respectively connected to one or more bit lines BL. Each page buffer unit may bias connected bit lines BL during a programming operation, and sense a voltage apparent on a connected bit line BL during read and program verification operations.

The control logic 140 is configured to control the overall operation of the nonvolatile memory device 100. As is conventionally understood, the control logic 140 operates in response to one or more externally provided control signal(s) CTRL and/or command(s) CMD.

Within the context of the illustrated embodiment of FIG. 1, certain embodiments of the inventive concept are characterized by a data management approach that rationally designates "first data" from "second data". For example, the first data may be program data received in relation to a first occurring programming operation, while the second data may be program data received in relation to a second (later) occurring programming operation. However, other definitions of first data and second data are possible, so long as two data sets are sufficiently distinct to enable different processing as provided by the precepts of the inventive concept described hereafter.

With this understanding, it is assumed that first data is provided to the page buffer 130 from the external device under the control of control logic 140 during a first programming operation, and that the address decoder 120 coincidentally receives a first address associated with the first data. Upon receiving the first data, the control logic may use the page buffer 130 to "partition" (i.e., divide or split) the first data into a plurality of smaller sets of "partitioned first data". As part of generating the partitioned first data, the control logic 140 may also use the address decoder 120 to manipulate the received address and generate appropriate partitioning addresses that facilitate programming of the partitioned first data to the memory cell array 110.

In particular, certain embodiments of the inventive concept partition the received first data according to a "single-bit page capacity" of one (1) physical page of memory cells within the memory cell array 110. Those skilled in the art will recognize that any memory cell array may be "physically" configured according to a particular connection of memory cells within the memory cell array. Such connections may be termed "a page" of memory cells. In one example, a physical page of memory cells may include memory cells commonly connected to (or commonly controlled by) particular control line(s), such as a word line, a string selection line, or a combination of a word line and a string selection line. Alternately or additionally, a physical page of memory cells may include memory cells commonly connected in a designated row, among the memory cells connected to a single word line. Thus, a plurality of physical pages may be connected to a single word line.

The designation "physical" in the term "physical page" distinguishes other approaches to designating particular grouping of memory cells, such as a logical page(s). Here again, those skilled in the art understand the difference(s) between physical pages (e.g., as defined by a particular physical connection scheme) and logical pages (e.g., as defined by a particular addressing or data access scheme). Accordingly, memory cell arrays consistent with embodiments of the inventive concept will include physical pages, each respectively associated with designated connection of memory cells. For example, a first physical page may be memory cells connected to a first word line, a second physical page may be memory cells connected to a second word line, etc.

Recognizing that each physical page may be formed by a connection of MLC, each physical page may include a number of logical pages. Hence, the term "single-bit page capacity" (1bPC) of a physical page denotes a number of memory cells (regardless of their multi-bit data storing ability) of the physical page. Thus, a physical page including 8K of MLC will have a single-bit page capacity of 8K. Whereas, assuming the use of MLC capable of being programmed to store up to 3-bits of data, the same physical page will have a "total-bit page capacity" (TbPC) of 24K or (3 bits per memory cell×8K of MLC in the physical page). A "reminder-bit page capacity" (RbPC) for the same physical page may be understood as the total-bit page capacity minus the single-bit page capacity, or (TbPC−1bPC=RbPC).

However, a particular physical page is designated within a memory cell array according to the inventive concept, the first data received by the page buffer 130 will be partitioned to generate partitioned first data, and then each resulting set of partitioned first data is respectively stored as single bit data in one of a plurality of physical pages within the memory cell array 110 using single bit programming data techniques. The foregoing recognizes that received data may be programmed to MLC as "single bit data" or as "multi-bit data" using various single bit programming techniques and operations or various multi-bit programming techniques and operations. Of note, single-bit programming operations provide greater data surety than multi-bit programming operations, while multi-bit programming operations are capable of storing more data per unit time than single-bit programming operations.

Thus, single-bit data corresponding to each partitioned first data is stored by embodiments of the inventive concept to MLC across a plurality of physical pages. In certain embodiments, each partitioned first data is programmed as single-bit, least significant bit (LSB) data to one logical page (LP) of each physical page (PP) of the plurality of physical pages storing the partitioned first data.

After the first data has been processed and programmed as partitioned first data across the plurality of physical pages, second data is received by the page buffer 130 under the control of control logic 140. Then, the control logic 140 selects at least one of the plurality of physical pages storing partitioned first data for use in storing the second data as multi-bit data using a multi-bit programming operation. Where the second data has a size exceeding the remainder-bit capacity of a single physical page, it may be divided across more than one of the plurality of physical pages storing the partitioned first data. Such division of the second data may be made using the remainder-bit capacity of a single physical page.

In the event that the second data has a size that is not equal to an integer multiple of the remainder-bit page capacity of a physical page, one additional (+1) physical page among the plurality of physical pages may be used to store a "remainder" of the second data. In similar practice, in the event that the first data has a size that is not equal to an integer multiple of the single-bit page capacity, one additional (+1) physical page may be used to store the remainder of the first data. In this manner, the data management approach provided by embodiments of the inventive concept is capable of efficiently processing first data and second data of any reasonable size and structure, regardless of potential mismatch between host defined incoming data and the bit structure and capacity of memory cells in the nonvolatile memory.

From the foregoing it may be understood that following execution of the first programming operation, MLC of each "first selected physical page" will have a binary state ("1" or "0") consistent with single bit data programmed by a single bit programming operation. Then, the control logic 140 executes a later-occurring second programming operation to additionally store the second data as multi-bit data in the MLC of at least one "second selected physical page" that has been selected from among the first selected physical pages. Further, according to embodiments of the inventive concept, the second programming operation of the second data is executed using multi-bit programming techniques, whereby multiple bits of the second data are simultaneously programmed to each second selected physical page.

For example, again assuming the use of 3-bit MLC, the second data may be programmed to MLC of the second selected physical pages according to two logical pages (e.g., as central significant bit (CSB) data and most significant bit (MSB) data). In such a case, each MLC having LSB data previously programmed to a first logical page, will have a second a third logical pages simultaneously programmed with the CSB and MSB data. Thus, following the second programming operation directed to the second data, the number of data bits stored in each MLC is increased from one to three. It should be noted at this point that when the CSB data and the MSB data are said to be "simultaneously programmed", this does not mean that the CSB data and the MSB data are sequentially programmed using sequential programming (sub)-operations. Rather, the simultaneous programming of multi-bit data to an MLC means that in the foregoing example the CSB data and the MSB data are simultaneously programmed to a MLC by a single programming operation. This distinction will be more fully described with reference to FIGS. 9 through 17.

The foregoing examples assume the use of 3-bit MLC storing LSB data, CSB data, and MSB data. However, the scope of the inventive concept is not limited to only this example, and MLC capable of storing four or more bits of data may be incorporated within certain embodiments of the inventive concept.

Of note, the use of a single-bit programming operation made in relation to a plurality of physical pages followed by a multi-bit programming operation made in relation to at least one of these physical pages inherently reduces the number of programming operations required to store both first and second data. Thus, overall programming speed (or data storage speed) is improved and power consumed is reduced.

Of further note, embodiments of the inventive concept effectively manage the programming of $2^N$ data received from a host under a particular assumption regarding the size of a physical page using a memory cell array configured from odd-bit MLCs (e.g., 3-bit MLC). This data compatibility management (or efficient data management) approach provided by embodiments of the inventive concept will be described in some additional detail with reference to FIGS. 11 to 15.

Figure 2:
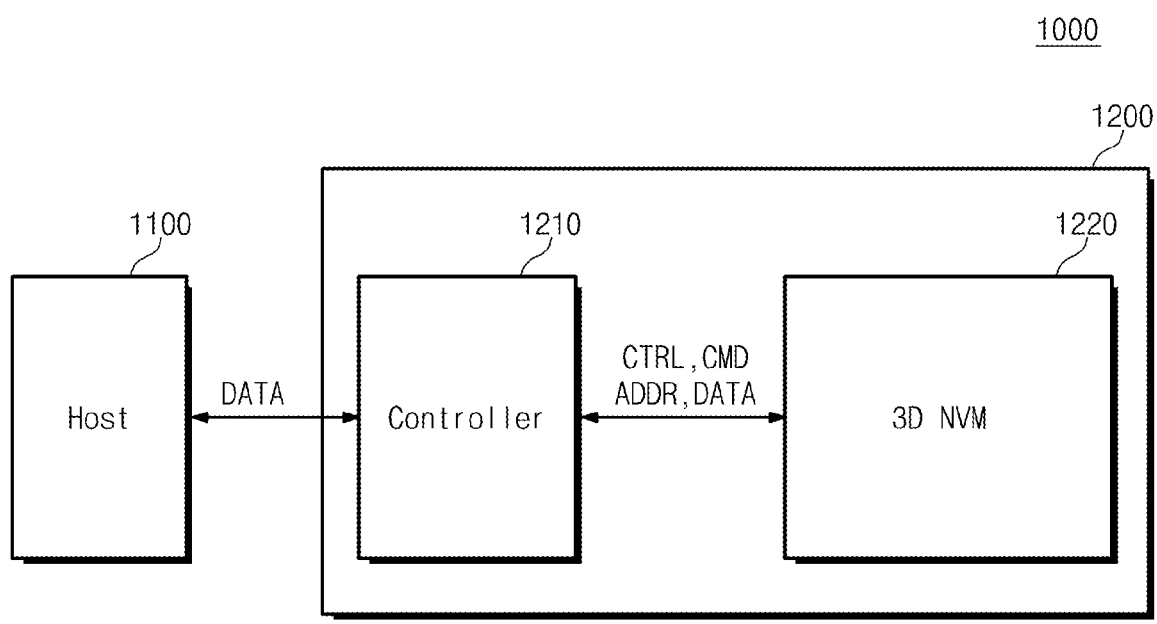
FIG. 2 is a block diagram illustrating a memory system according to an embodiment of the inventive concept.

FIG. 2 is a block diagram illustrating a memory system according to an embodiment of the inventive concept. Referring to FIG. 2, a memory system 1200 comprises a controller 1210 and a nonvolatile memory (NVM) 1220. A host system 1000 communicates (programs to and reads from) data with the memory system 1200. The NVM 1220 may be configured like the memory 100 of FIG. 1 described above, and may in certain embodiments incorporate a 3D memory cell array. The NVM 1220 may be configured to receive control signal(s) CTRL, command(s) CMD, address(es) ADDR and data (DATA) from the controller 1210 during certain operations, and to return data (DATA) to the controller 1210 as the result of some operations.

The controller 1210 may be used to control the execution of read, program, and erase operations directed to selected memory cells of the NVM 1220, and to serve as an interface with the host 1100. Accordingly, the controller 1210 may cause data received from the host 1100 to be programmed to the NVM 1220, and may cause data read from the NVM 1220 to be returned to the host 1100.

In certain embodiments of the inventive concept, the NVM 1220 will execute programming operations in accordance with a physical page definition (i.e., a physical page unit). Thus, when the controller 1210 receives first data (i.e., program data associated with a first programming operation) from the host 1100, it partitions the first data according to a single-bit page capacity of a physical page (e.g., according to a number of MLC included in one physical page, as said physical page is defined within the NVM 1220). Once the resulting partitioned first data is generated, the controller 1210 programs the partitioned first data across a plurality of physical pages as single-bit data.

Accordingly, the partitioned first data may be stored in the LSB page of each one of the plurality of physical pages, wherein the single-bit page capacity of each LSB page is equal to the number of MLC included in a physical memory. For example, it is assumed that 16 KB of first data is received from the host 1100, that one physical page of the NVM 1220 includes a LSB page having a single-bit page capacity of 8 KB, and that a total-bit capacity of the physical page is 24 KB (3-bit MLC×8 KB). With these assumptions, the first data is partitioned into two partitioned first data portions (16 KB/8 KB=2) by the controller 1210, and two (2) physical pages are selected by the controller 120 to store the partitioned first data as single-bit data.

Thereafter, the controller 1210 sends the partitioned first data to the NVM 1220, and controls the NVM 1220 to store the partitioned data in the two (2) selected physical pages as single-bit data (i.e., using a single-bit programming operation to store LSB data to 3-bit MLC). Thus, the partitioned first data is said to be stored "across" the plurality of (first selected) physical pages as single-bit data. Under the foregoing assumptions, the partitioned first data is stored across the plurality of physical pages as LSB data in relation to a defined logical page designated for the LSB data.

Once the first programming operation is complete, the partitioned first data may be retained, accessed or modified in relation to the LSB page of the MLC of the plurality of physical pages. However, at some later point in time, second data, perhaps associated with a second programming operation, is received by the controller 1210. Per the foregoing, the second data may now be programmed to at least one of the plurality of physical pages as multi-bit data being simultaneously programmed to the corresponding MLC. To do this, the controller 1210 compares the size of the second data with the remainder-bit capacity of each physical page of the first selected physical pages in order to determine a number of second selected physical pages among the first selected physical pages within the NVM 1220. For example, again assuming that the MLC of the NVM memory 1220 are 3-bit MLC, each physical page will have a remainder-bit page capacity of 16 KB (or 24 KB of TbPC–8 KB of 1bPC). Further assuming that the second data is 16 KB in size, one of the first selected physical pages will be designated as a second selected physical page among the two (2) first selected physical pages to simultaneously store the 16 KB of data as 2-bit data (e.g., CSB and MSB logical pages) in the MLC of the second selected physical page.

Further assuming that each MLC of the NVM 1220 is a CTF memory cell, word line interference is dramatically reduced over analogous programming of floating gate memory cells. Hence, although multi-bit data is simultaneously programmed during the second programming operation, the probability of a program fail due to word line interference is greatly reduced.

Thus, it may be understood from the foregoing examples that embodiments of the inventive concept provide efficient use of all available data storage capacity (i.e., the data storage capacity of each physical page of MLC), despite the inherent mismatch of $2^N$ sized data being provide by the host 1100 with the 3-bit sized MLC of the NVM 1220.

Diverging from the previous example, it is now assumed that the second data has a size of 32 KB. Accordingly, both of the two (2) first selected physical pages is designated as a second selected physical page, and each one of the two (2) second selected pages is used to store 16 KB of the second data. Division of the second data by the controller 1210 is made according to the remainder-bit capacity for each one of the second selected physical pages.

To again emphasize, overall data compatibility between the host 1100 providing $2^N$ (first and second) data and the physical page definition within the NVM 1220 including 3-bit MLC (one example of non-$2^N$ data based memory cells) is markedly improved by the use of a programing method consistent with embodiments of the inventive concept. This is particularly important where legacy host devices or legacy data file definitions have established a $2^N$ data structures and data transfer assumptions that may not be influenced or modified by manufacturers of contemporary nonvolatile memory devices.

As has been previously noted, certain nonvolatile memory devices consistent with the teachings of the inventive concept will incorporate a 3D memory cell array in order to, among other advantages, significantly increase the data density provided the memory device. To further illustrate this broad class of embodiments an exemplary 3D NAND flash memory cell array will now be described in relation to FIGS. 3, 4 and 5. However, the scope of the inventive concept is not limited to only 3D NAND flash memory cell arrays, but extends across other 3D memory cell arrays incorporating other types of nonvolatile memory cells.

Figure 3:
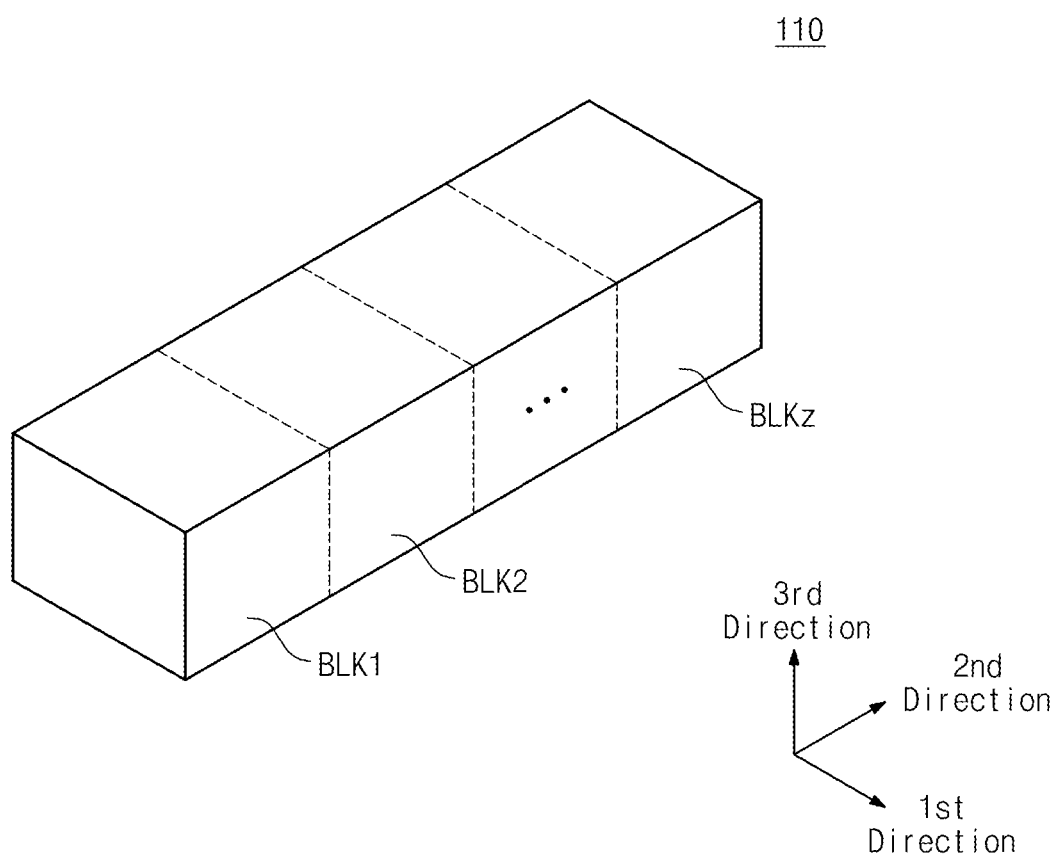
FIG. 3 is a diagram further illustrating one possible example of the memory cell array of FIG. 1 according to an embodiment of the inventive concept.

FIG. 3 is a conceptual diagram illustrating a 3D memory cell array that may be used as the memory cell array 110 of FIG. 1 according to an embodiment of the inventive concept. Referring to FIG. 3, a memory cell array 110 includes a plurality of memory blocks BLK1 to BLKz, each of which is formed with a three-dimensional structure (or, a vertical structure, or a stacked structure). Thus, each of the memory blocks BLK1 to BLKz includes memory cell structures extending in first, second and third mutually orthogonal directions. Although not shown in FIG. 3, each of the memory blocks BLK1 to BLKz may include a plurality of cell strings extending in the second direction, for example, where the plurality of cell strings are respectively spaced apart from one another in the first and third directions.

As will be conventionally appreciated, cell strings in a memory block may be variously connected in relation to a plurality of bit lines, a plurality of string selection lines, a plurality of word lines, one or more ground selection lines, and a common source line. Cell strings in the plurality of memory blocks BLK1 to BLKz will share the plurality of bit lines according to various connection schemes. For example, the plurality of bit lines may extend in the second direction so as to be shared by the plurality of memory blocks BLK1 to BLKz.

Respective memory blocks BLK1 to BLKz may be selected by operation of the address decoder 120 (FIG. 1) in response to a received address. Erase, programming, and read operations directed to certain memory cells in a selected memory block may then be performed.

Figure 4:
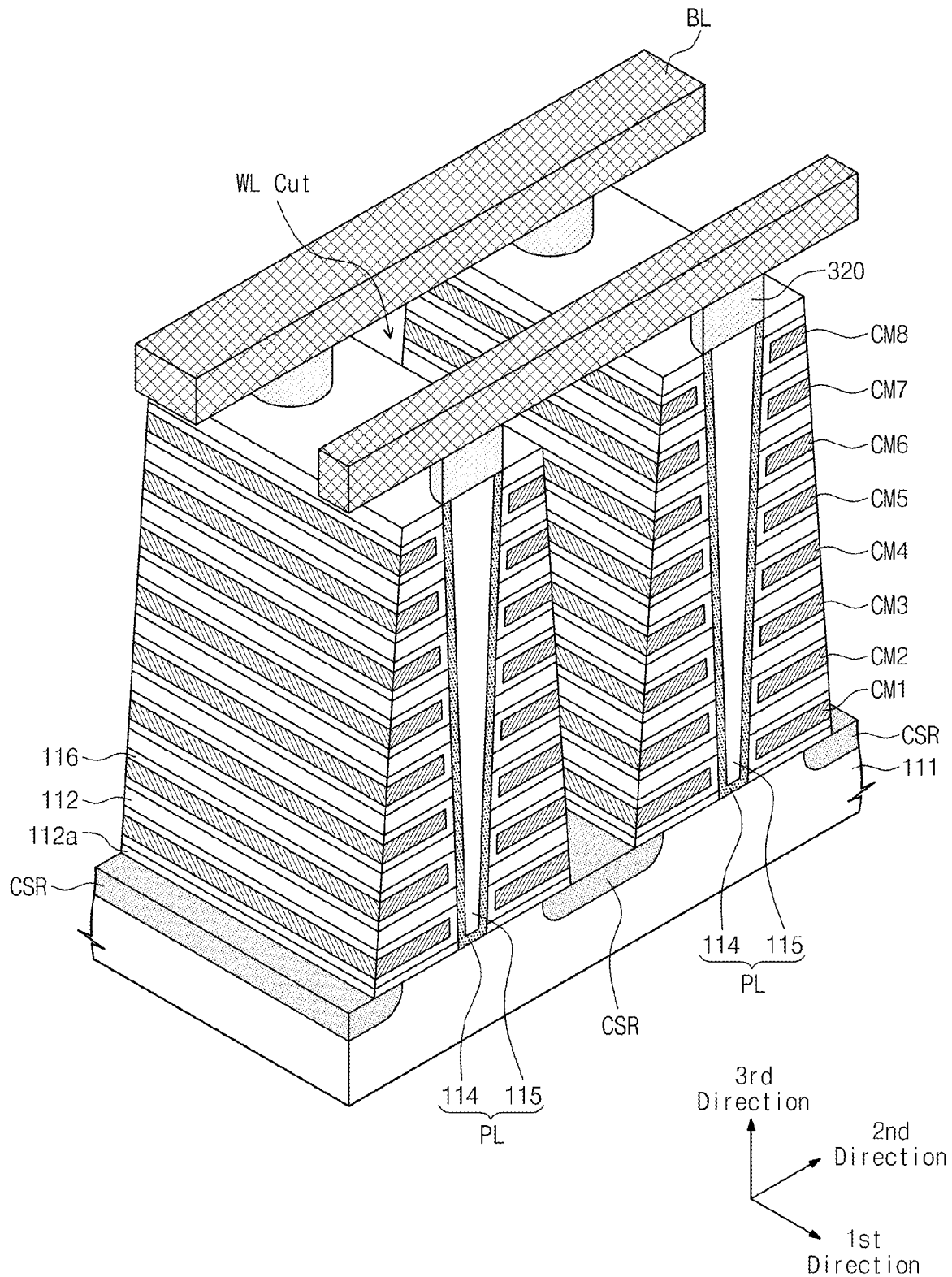
FIG. 4 is a perspective view further illustrating one memory block of the 3D memory cell array of FIG. 3.

FIG. 4 is a perspective view further illustrating one of the plurality of memory blocks BLK1 to BLKz shown in FIG. 3. Consistent with the three layout directions shown in FIG. 3, FIG. 4 shows certain elements of the 3D memory cell array structure in some additional detail.

The 3D memory cell array is formed on a principle substrate 111. In the illustrated example of FIG. 4, the substrate 111 is assumed to have a first conductivity type (e.g., P-type). For example, the substrate 111 may be a P-well formed from one or more elements (e.g., boron) selected from Group III elements. In certain embodiments, the substrate 111 may be a pocket P-well formed within an N-well.

A plurality of common source regions CSR extending in the first direction is provided in the substrate 111. The common source regions CSR are spaced apart one from the other in the second direction. When electrically connected these common source regions CSR form a common source line (CSL). The common source regions CSR are assumed to have a second conductivity type (e.g., N-type) different from the first conductivity type of the substrate 111.

Between adjacent common source regions CSR, insulation materials 112 and 112a are sequentially provided on the substrate 111 in the third direction (i.e., the direction vertically perpendicular to the substrate 111). Different depositions of the insulation materials 112 and 112a are spaced apart in the third direction, and the insulation materials 112 and 112a extend in a planar manner in the first and second directions. In certain embodiments, the insulation materials 112 and 112a will be formed from one or more semiconductor oxide film(s), and the thickness of the insulation material 112a directly contacting the substrate 111 may be less than the thickness of other insulation materials 112.

Between two adjacent regions of the common source regions CSR, a plurality of pillars PL are sequentially arranged in the first direction so as to penetrate the plurality of insulation materials 112 and 112a in the second direction. For example, the pillars PL may contact with the substrate 111 through the insulation materials 112 and 112a.

In the illustrated embodiment of FIG. 4, the pillars PL between two adjacent common source regions CSR are spaced apart in the first direction, and are disposed in line extending in the first direction. The pillars PL may be formed using different materials. For example, each pillar PL may include a channel film 114 and an inner material 115 provided within the channel film 114.

Each channel film 114 may be formed from a semiconductor material (e.g., silicon) of first conductivity type. Each inner material 115 may be formed from an insulation material, such as silicon oxide. Alternatively, each inner material 115 may be formed by an air gap.

Between two adjacent regions of the common source regions CSR, information storage films 116 are provided on the respective principle surface of each of the insulation materials 112 and 112a, and side edges of the information storage films 116 are exposed by the pillars PL. The information storage films 116 will be a material capable of storing information by selectively trapping and discharging electrical charge.

Between two adjacent common source regions CSR and between the insulation materials 112 and 112a, conductive materials CM1 to CM8 are respectively provided in electrical contact with the information storage films 116. Thus, in the illustrated embodiment of FIG. 4 the conductive materials CM1 to CM8 extend in the first direction, such that the conductive materials CM1 to CM8 on the common source regions CSR may be separated by word line cuts. The common source regions CSR may be exposed by the word line cuts, wherein the word line cuts also extend in the first direction.

The conductive materials CM1 to CM8 may be formed from a metallic conductive material and/or a nonmetallic conductive material such as polysilicon.

The information storage films 116 provided on an upper surface of an insulation material, placed at the uppermost layer, from among the insulation materials 112 and 112a are removed. That is, information storage films 116 provided at sides opposite to the pillars PL from among sides of the insulation materials 112 and 112a are removed.

A plurality of drains 320 are respectively provided in relation to the plurality of pillars PL. Each drain 320 may be formed from a semiconductor material (e.g., silicon) of second conductivity type, and extend to an upper side of the channel films 114 of the pillars PL.

Bit lines BL extending in the second direction are provided in electrical contact with the drains 320 and are spaced apart in the first direction. In the illustrated embodiment of FIG. 4, the drains 320 and the bit lines BL are connected via contact plugs (not shown). The bit lines BL may be formed from one or more metallic conductive material(s), and/or one or more nonmetallic conductive material such as polysilicon.

As shown by way of selected example in FIG. 4, the conductive materials CM1 to CM8 essentially define first through eighth respective "heights" above the substrate 111. Of course the designation of respective vertical heights above the substrate is an arbitrary description of relative geometric relationship. The inventive concept is not limited to a particular orientation of above/below; vertical/horizontal; up/down; etc. These relative geometric descriptive terms are merely used to clearly teach the nature, making and use of certain embodiments of the inventive concept.

The plurality of pillars PL may form a plurality of cell strings together with the information storage films 116 and the plurality of conductive materials CM1 to CM8. Each of the pillars PL may form a cell string with the information storage film 116 and adjacent conductive materials CM1 to CM8.

The pillars PL may be provided on the substrate 111 along defined "row" and "column" directions. For example, the eighth conductive material CM8 may constitute a number of rows, while pillars connected to the eighth conductive material CM8 may be used to select one particular row from the number of rows. The bit lines BL may constitute columns.

Hence, pillars connected with the same bit line BL constitute a column. The pillars PL may constitute a plurality of strings arranged along row and column directions together with the information storage films 116 and the plurality of conductive materials CM1 to CM8. Each cell string may include a plurality of cell transistors CT stacked in a direction perpendicular to the substrate 111.

Figure 5:
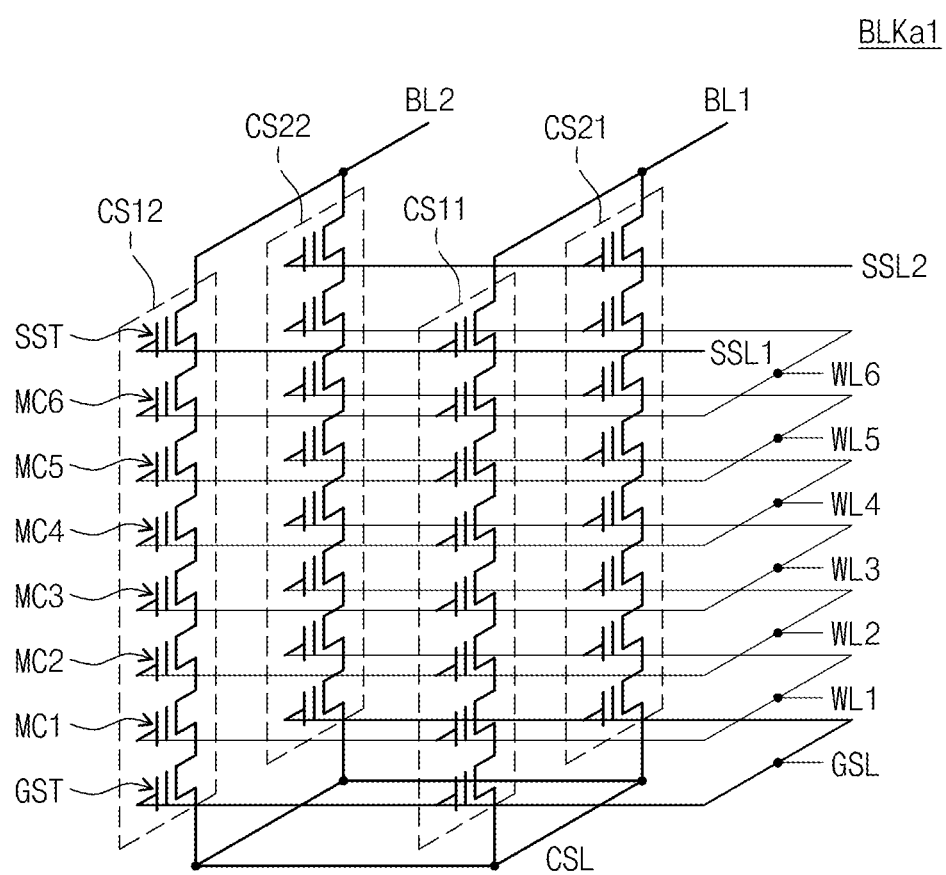
FIG. 5 is an equivalent circuit diagram of a relevant portion of the memory block of FIG. 4 according to an embodiment of the inventive concept.

FIG. 5 is an equivalent circuit diagram further illustrating the 3D memory cell array of FIG. 4 according to an embodiment of the inventive concept. Here, a memory block BLKa1 includes cell strings CS11, CS12, CS21, and CS22, each of which includes a string selection transistor SST, a ground selection transistor GST, and memory cells MC1 to MC6. In each cell string, the memory cells MC1 to MC6 are connected between a string selection transistor SST and a ground selection transistor GST.

Control gates of the ground selection transistors GST in the cell strings CS11, CS12, CS21, and CS22 are commonly connected to a ground selection line GSL. Respective first ends of the ground selection transistors GST are connected with memory cells MC1, and respective second ends are commonly connected to the common source line CSL.

The memory cells MC1 in the cell strings CS11, CS12, CS21, and CS22 are commonly connected (i.e., electrically controlled as a group by) with a word line WL1, the memory cells MC2 in the cell strings CS11, CS12, CS21, and CS22 are commonly connected with a word line WL2, the memory cells MC3 in the cell strings CS11, CS12, CS21, and CS22 are commonly connected with a word line WL3, the memory cells MC4 in the cell strings CS11, CS12, CS21, and CS22 are commonly connected with a word line WL4, the memory cells MC5 in the cell strings CS11, CS12, CS21, and CS22 are commonly connected with a word line WL5, and the memory cells MC6 in the cell strings CS11, CS12, CS21, and CS22 are commonly connected with a word line WL6.

In the cell strings CS11 and CS12, control gates of the string selection transistors SST are connected with a string selection line SSL1. In the cell strings CS21 and CS22, control gates of the string selection transistors SST are connected with a string selection line SSL2. In the cell strings CS11 and CS21, one end of each string selection transistors SST is connected with a bit line BL1, and the other end is connected with the memory cells MC6. In the cell strings CS21 and CS22, one end of the string selection transistors SST is connected with a bit line BL2, and the other end is connected with the memory cells MC6.

As may be seen from this exemplary configuration, a plurality of rows, columns, and heights may be defined within a 3D memory cell array in relation to connecting elements such as word lines, bit lines, etc. Thus, the "row direction" may be defined as a direction in which the string selection lines SSL1 and SSL2 extend, such that the cell strings CS11 and CS12 are arranged in the row direction to form a first row and the cell strings CS21 and CS22 are arranged in the row direction to form a second row.

The "column direction" may be defined as a direction in which the bit lines BL1 and BL2 extend. Hence, the cell strings CS11 and CS21 are arranged in the column direction to form a first column, and the cell strings CS12 and CS22 are arranged in the column direction to form a second column.

A respective height may be defined as a particular distance from the ground selection transistors GST and/or the string selection transistors SST.

Accordingly, the memory cells MC1 to MC6 may be arranged in relation to row and column directions as well as a height in a stacked 3D structure. For example, memory cells at the same height in the illustrated embodiment of FIGS. 4 and 5 are commonly connected with a word line, and memory cells at different heights are connected with different word lines. String selection transistors SST in the same row are commonly connected with one string selection line SSL1 or SSL2, and the string selection transistors SST in different rows are connected with different string selection lines SSL1 and SSL2. The string selection transistors SST in the same column are connected with the same bit line BL1 or BL2, and the string selection transistors SST in different columns are connected with different bit lines BL1 and BL2.

In certain embodiments of the inventive concept, each of the memory cells MC1 to MC6 will be a MLC capable of storing two or more bits of data in relation to correspondingly defined threshold voltage distributions.

FIGS. 4 and 5 illustrate only a single memory block BLKa1 including four (4) cell strings CS11, CS12, CS21, and CS22, wherein each cell string includes six (6) memory cells MC1 to MC6. However, the scope of the inventive concept is not limited to only this simple example. For example, two or more cell strings may be provided in a row direction or a column direction, or two or more memory cells may be provided in a cell string at the same height. In similar vein, it is noted that FIG. 4 illustrates an example where the ground selection transistors GST are commonly connected to a single ground selection line, but this need not be the case. The string selection transistors SST, ground selection transistors GST in the same row may be commonly connected with one ground selection line, and ground selection transistors GST in different rows may be connected with different ground selection lines.

In the illustrated embodiment of FIG. 4, each cell string includes a string selection transistor SST and a ground selection transistor GST. However, each cell string can be include two or more string selection transistors and/or two or more ground selection transistors.

Further, each cell string may include one or more dummy memory cells.

Figure 6:
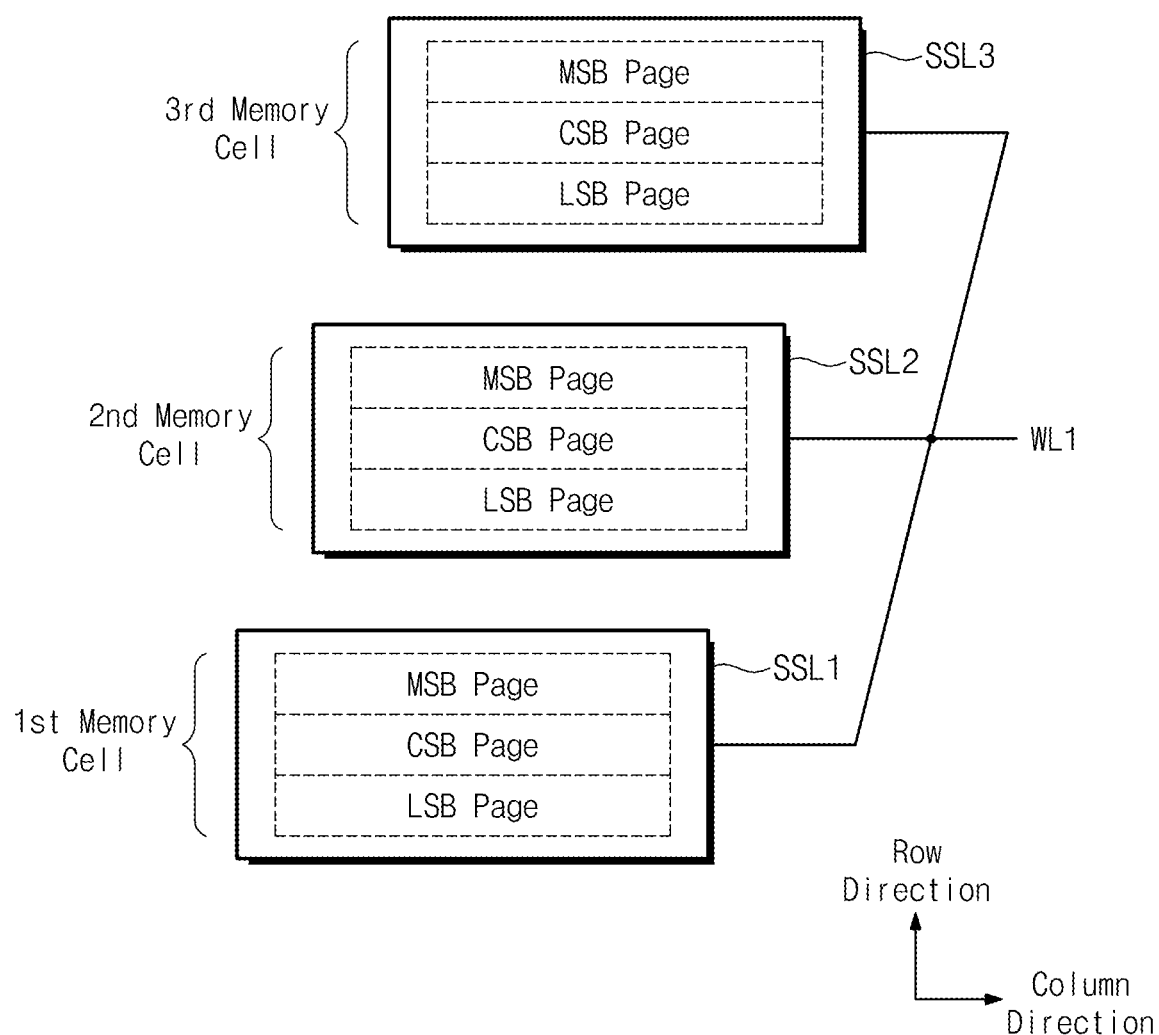
FIG. 6 is a conceptual diagram further illustrating a possible physical page definition for memory cells of the memory block in FIG. 4.

FIG. 6 is a conceptual diagram illustrating one approach to defining a physical page of memory cells in the context of a word line in the exemplary memory block of FIGS. 4 and 5. Referring to FIGS. 4, 5 and 6, each of memory cells MC1 to MC6 is assumed to be a 3-bit MLC capable of storing single-bit LSB data, CSB data, and MSB data according to respective logical pages (e.g., a LSB page, CSB page and MSB page). The first, second and third memory cells of FIG. 6 while being commonly connected to a first word line (WL1) in the 3D memory cell array of FIGS. 4 and 5 are arranged respectively in a first row, a second row, and a third row. Thus, multiple rows (and in certain embodiments of the inventive concept corresponding physical pages) of MLC are commonly connected to the same word line within a 3D memory cell array. That is, consistent with a given memory cell array definition, for example, memory cells connected in the same row, among a plurality of rows commonly connected to the word line, may be deemed one (1) physical page having a specific total bit-page capacity and single-bit page capacity.

Thus, in the illustrated example of FIG. 6, the first, second and third memory cells are disposed in respective physical pages. Each physical page includes multiple, single-bit, logical pages (e.g., LSB page, CSB page and MSB page). Further, the multiple physical pages commonly connected to the first word line may be respectively selected using the string selection lines SSL1, SSL2, and SSL3. The conceptual illustration of FIG. 7 describes this approach in some additional detail.

Figure 7:
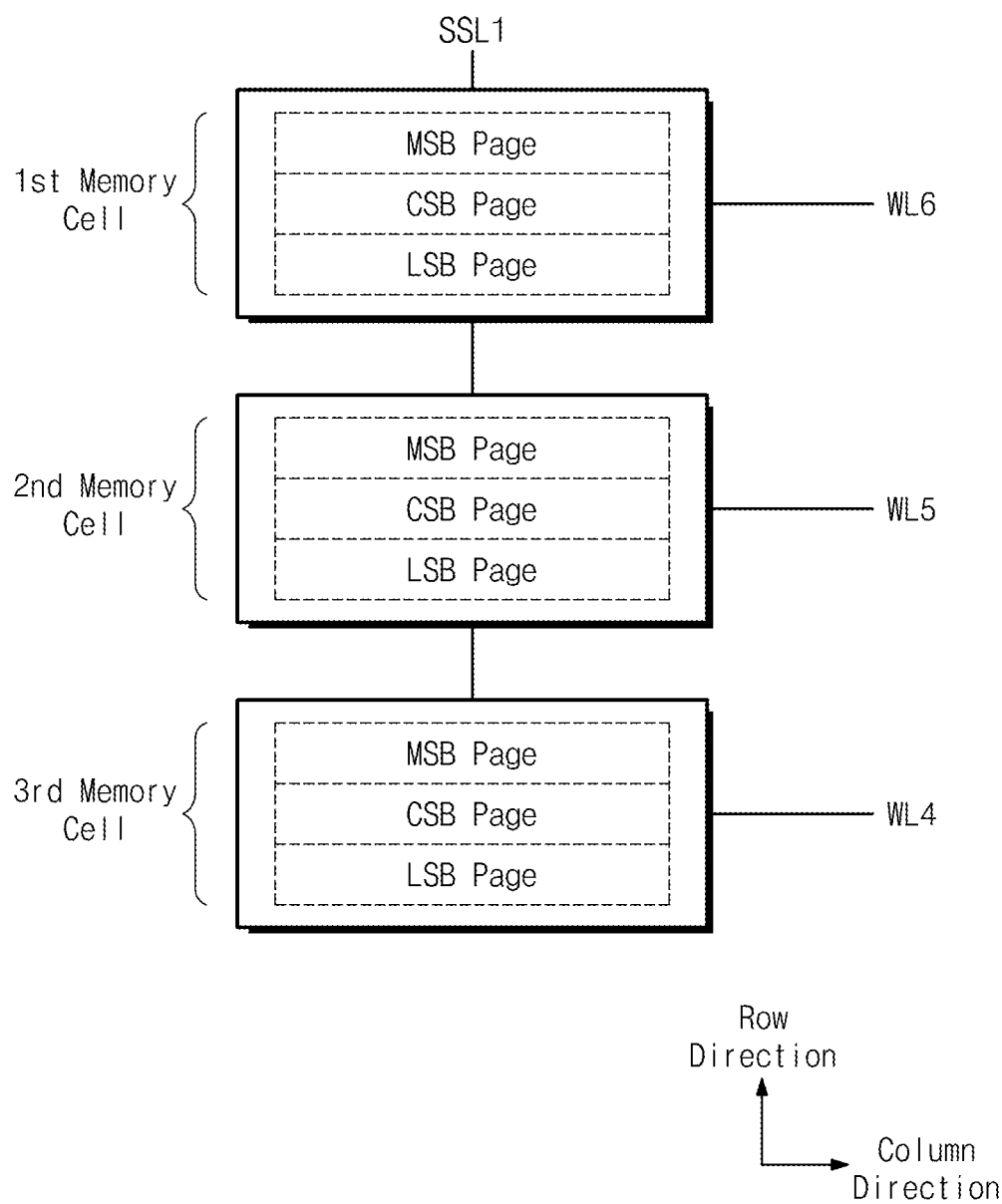
FIG. 7 is another conceptual diagram further illustrating a possible physical page definition for memory cells of the memory block in FIG. 4.

FIG. 7 illustrates a connection of MLC arranged in multiple pages and commonly connected with a string selection line within the memory cell array of FIGS. 4 and 5. Referring to FIGS. 4, 5 and 7, a first string selection line SSL1 is connected with a plurality of physical pages, each physical page being connected to a respective word line (e.g., WL4, WL5 and WL6). Here again, each of the first, second and third memory cells is assumed to be a 3-bit MLC capable of storing single-bit LSB data, CSB data, and MSB data according to respective logical pages (e.g., a LSB page, CSB page and MSB page).

Figure 8:
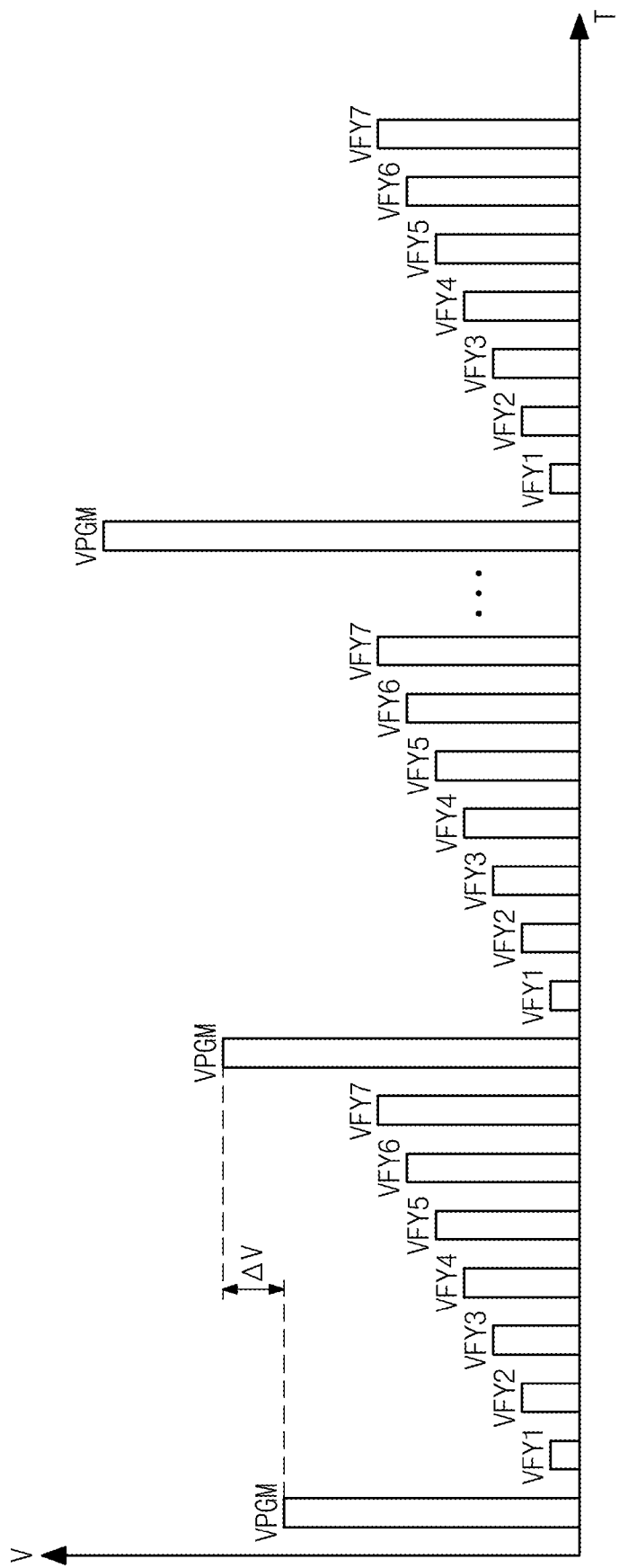
FIG. 8 is a diagram illustrating in relevant portion a collection of voltages that may be used during a programming operation directed to a nonvolatile memory device according to an embodiment of the inventive concept.

FIG. 8 is a diagram illustrating certain control voltages that may be used during a programming operation directed to MLC in the 3D nonvolatile memory device of FIGS. 1-7. In FIG. 8, the horizontal axis may indicates time T, and the vertical axis indicates a level of an applied voltage V.

Referring to FIG. 8, a program voltage VPGM may be applied to one selected from word lines WL1 to WL6. Then, verification voltages VFY1 to VFY7 may be sequentially applied to the selected word line. The verification voltages VFY1 to VFY7 may be voltages to program multi-page data at the same time. The verification voltages VFY1 to VFY7 may be voltages to determine whether threshold voltages of programmed memory cells reach target levels.

Where a program-failed memory cell is detected, the program voltage VPGM may be again applied to the selected word line, after the program voltage VPGM is increased by a defined increment $\Delta V$. Thereafter, the verification voltages VFY1 to VFY7 may be sequentially applied to the selected word line.

The program voltage VPGM and the verification voltages VFY1 to VFY7 may be iteratively applied to the MLC of the selected word line until such time as all of the memory cells are passed (i.e., successfully programmed), wherein the program voltage VPGM may be incremented by $\Delta V$ for each successive iteration. As will be conventionally appreciated, this type of programming operation is generically referred to as incremental step pulse programming (ISPP), and there are many different specific approaches to ISSP—the illustrated example of FIG. 8 being only one.

Figure 9:
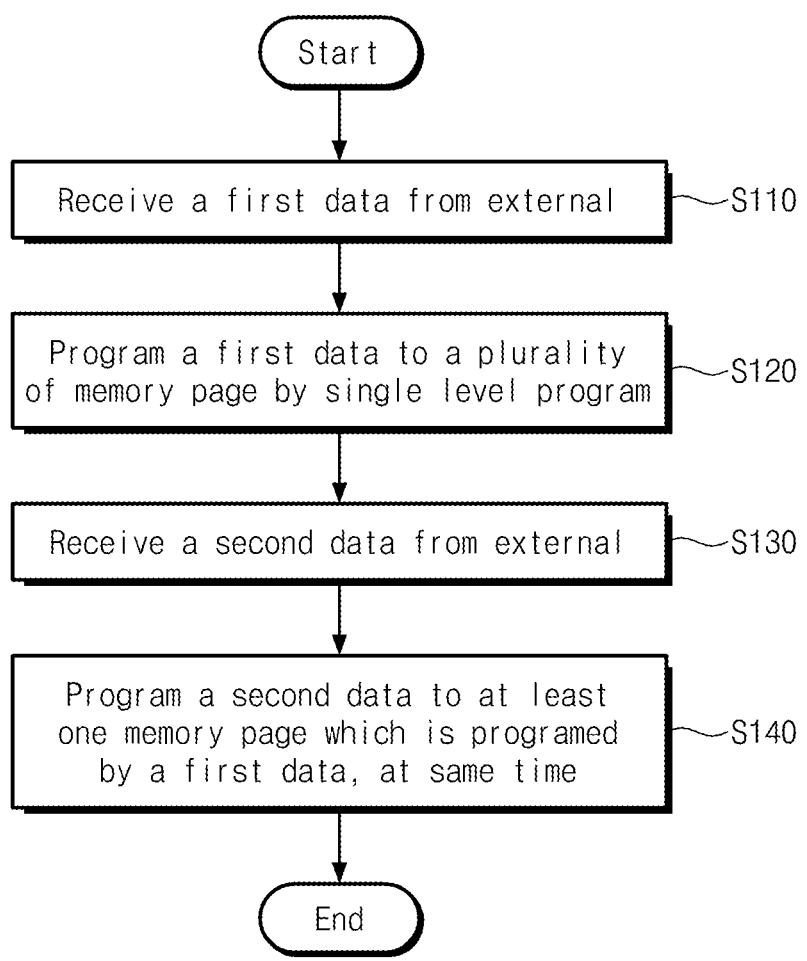
FIG. 9 is a flow chart summarizing a programming method for a nonvolatile memory device according to an embodiment of the inventive concept.

FIG. 9 is a flow chart summarizing one programming method that may be used in accordance with certain embodiments of the inventive concept. The method described in FIG. 9 assumes a nonvolatile memory perspective, whereas the method describe in relation to following FIG. 10 assumes a controller perspective.

Referring to FIGS. 2 and 9, the memory system 1200 receives first data from an external source such as host 1100 via controller 1210 (S110). The first data may have been provided to the memory system 1200 as part of a first programming operation, and it is assumed for purposes of this explanation that the first data has a $2^N$ size larger than the single-bit page capacity of the physical pages defined in the constituent NVM 1220 of the memory system 1200.

Upon receipt by the memory system 1200 the first data may have already been partitioned according to the single-bit page capacity of physical pages in the NVM 1220 of the memory system 1200. Hence, the partitioned first data may be stored across a plurality of physical pages in the NVM 1220 using a single-bit programming technique (S120).

For example, each physical page may include a set of memory cells commonly connected to the row among the memory cells (and possibly among a plurality of rows) connected to the word line. As described above, each physical page may include a plurality of logical pages (e.g., an LSB page, a CSB page, and an MSB page). Further, if a 3D memory cell array is assumed, the memory system 1200 may select from among a plurality of physical pages connected to the word line by selecting a string selection line SSL. Hence, for purposes of the first programing operation the programming of the partitioned first data as single-bit data (per a LSB page, or some other logical page) across a plurality of physical pages, said physical pages may be termed "first selected physical pages."

Then, at some later point in time following receipt of the partitioned first data, the memory system 1200 receives second data from an external source, such as host 1100 via controller 1210 (S130). The second data may have been provided to the memory system 1200 as part of a second (later-occurring) programming operation, and it is assumed for purposes of this explanation that the second data has a $2^N$ size, albeit different from the size of the first data, yet still greater than the single-bit page capacity of the physical pages.

Accordingly, the second data will have been divided in accordance with the remainder-bit capacity of the first selected physical pages, such that at least one of the first selected physical pages (referred to as "second selected physical page(s)") is used to store the second data using a multi-bit programming technique (S140). It should be noted that the second programming of multi-bit data is performed by simultaneously relative to multiple bits of the multi-bit data stored in the MLC of each second selected physical page.

Thus, the partitioned first data is programmed to the 3-bit MLC assumed in the working example using a single-bit programming technique. Hence, each MLC of the first selected physical pages will be programmed to an erase state or a programmed state (i.e., a data value of "1" or "0"). (See, FIG. 13). Then, the second data is programmed to the 3-bit MLC using a multi-bit programming technique, after which each MLC of the second selected page(s) will be programmed to one of eight (8) possible states respectively corresponding to the 3-bit data values of '111', '110', '101', '011', '100', '010', '001', and '000'. (See, FIG. 17). The second programming transition of the threshold voltage distributions of the MLC in the second selected physical pages from a single-bit data value to a three-bit data value happens simultaneously in relation to two of the three bits being stored by each MLC. In other words, the second programming operation is a so-called "one-shot programming operation."

In the working example, the single bit data first programmed to the MLC of the first selected physical pages may be LSB data, while the multi-bit data second programmed to the second selected physical pages may be CSB and MSB data.

However, the foregoing assumption about the 3-bit nature of the MLC is not limiting to the scope of the inventive concept. If 4-bit MLC are used, the second programming operation might simultaneously program $2^{nd}$ through $4^{th}$ significant bits of the MLC following the first programming operation directed to only the $1^{st}$ significant bit. Similarly, 5-bit and higher MLC are susceptible to the benefits afforded by embodiments of the inventive concept.

Figure 10:
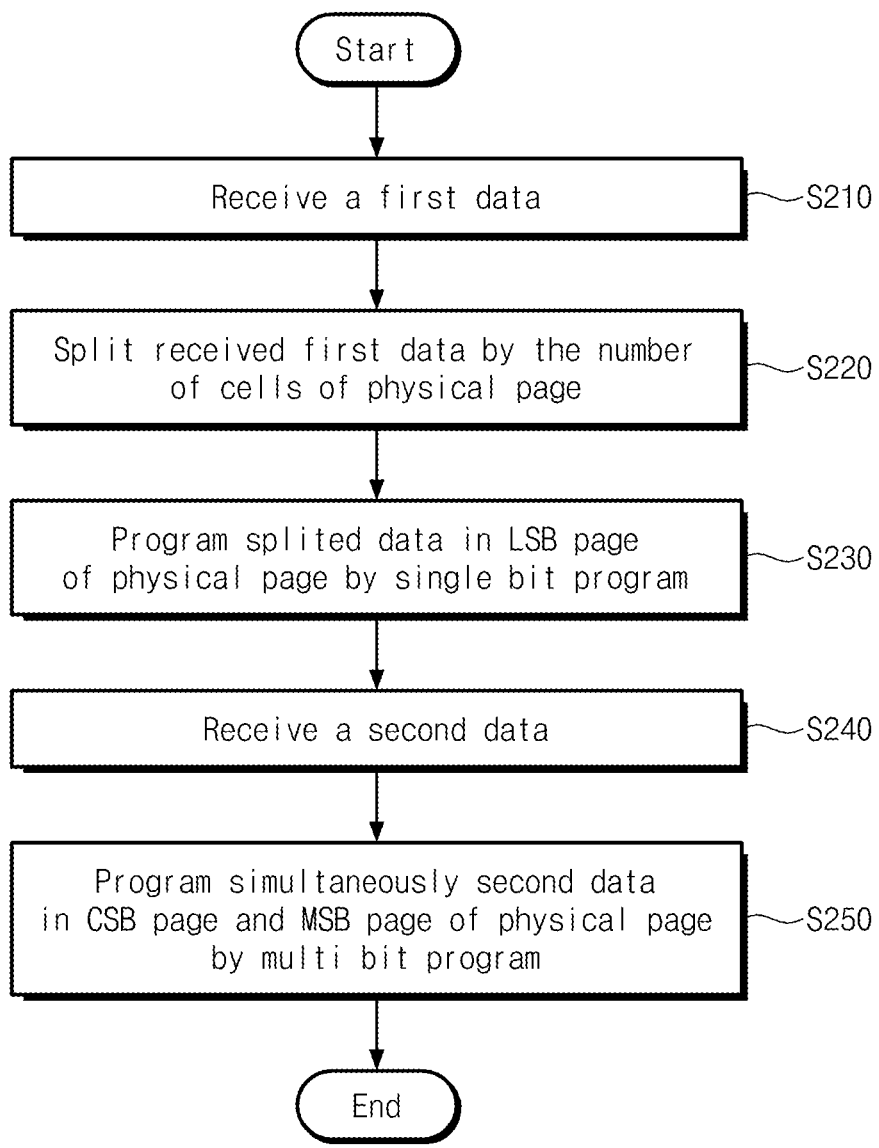
FIG. 10 is another flow chart summarizing in some additional detail a programming method for a nonvolatile memory device according to an embodiment of the inventive concept.

FIG. 10 is a flow chart summarizing the programming method of FIG. 9 from the perspective of the controller 1210 according to certain embodiments of the inventive concept. Similar assumptions are made to continue with working example.

Thus, the controller 1201 of the memory system 1200 receives the first data from the host 1110 (S210), and then partitions the first data according to the single-bit page capacity of physical pages defined in the NVM 1220 (S220). Thereafter, the partitioned first data is stored as single-bit data across a plurality of first selected physical pages (S230).

Then, at some later point in time following receipt of the partitioned first data, the controller 1201 of the memory system 1200 receives second data from the host 1100 (S240). The controller 1210 compares the size of the second data with the remainder-bit page capacity of the first selected physical pages and determines how many of the first selected physical pages are necessary to store the second data as multi-bit data (the second selected physical pages). Then, the second data is programmed to the second selected physical pages as multi-bit data, wherein at least two bits of the multi-bit data are simultaneously programmed to the MLC of the second selected physical pages (S250).

As previously noted, the programming methods described in relation to FIGS. 9 and 10 provided very efficient use of available memory space, despite a possible mismatch between the $2^N$ size of the first and second data and the odd-bit (e.g., 3-bit) data storage capacity of the MLC in a nonvolatile memory device. As a result, fewer garbage collection operations will be necessary to avoid waste of available data storage capacity in the nonvolatile memory, thereby improving the operating efficiency of the memory system. Fewer housekeeping operations extends the useful lifetime of the nonvolatile memory cells, and reduces overall power consumption.

From the foregoing, those skilled in the art may readily understand how third and subsequent programming operations may be similarly handled. Each programming operation in turn may be executed using, where available, first selected physical pages having available data storage capacity. In the absence of first selected physical pages having available data storage capacity, "new" first selected physical pages may be created as explained above. Thus, incoming program data of any reasonable size and structural definition may be efficiently processed and programmed. Legacy data definitions may be accommodated without loss of data programming and data storage efficiencies.

Further examples of certain programming methods according to embodiments of the inventive concept will be described in relation to FIGS. 11 through 17.

Figure 11:
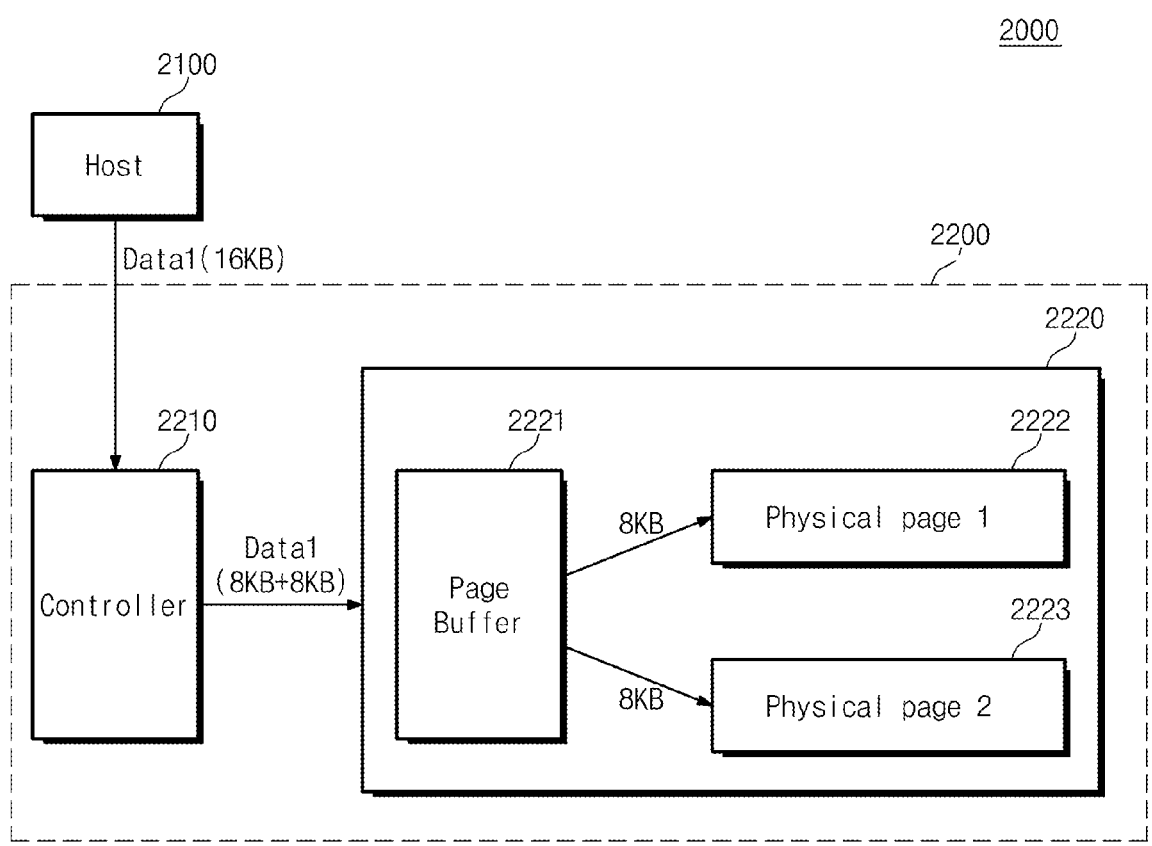
FIG. 11 is a block diagram schematically illustrating operation of a memory system according to an embodiment of the inventive concept.

FIG. 11 is a block diagram illustrating a user device 2000 according to an embodiment of the inventive concept. Referring to FIG. 11, the user device 2000 generally comprises a host 2100 and a memory system 2200. The memory system 2000 includes a controller 2210 and a nonvolatile memory 2220. The nonvolatile memory 2220 includes a page buffer 2221 and a memory cell array including at least two or more physical pages 2222 and 2223.

It is assumed that the host 2100 is a digital device that transfers data to the nonvolatile memory in a data set having a size of $2^N$ KB, where N is an integer greater than 1.

Each of the physical pages 2222 and 2223 is assumed to have a single bit page capacity of 8 KB, where the single bit page capacity indicates a data capacity for the physical page when each memory cell of the physical page acts as a single level cell (SLC). Thus, the single bit page capacity of each of the physical pages 2222 and 2223 will be based on the number of memory cells included in the physical page. Thus, if each of the physical pages 2222 and 2223 includes 8K memory cells, the single bit page capacity of each of the physical pages 2222 and 2223 will be 8 KB. Only memory cells in a physical page actually used to store data are considered in determination of the single bit page capacity. So, dummy memory cells are not considered for this purpose.

Assuming each of the memory cells includes in each of the physical pages 2222 and 2223 is a 3-bit MLC, the total-bit page capacity for each of the physical pages 2222 and 2223 will be a product of the number of MLC bits (e.g., 3) and the single bit page capacity. Thus, each of the physical pages 2222 and 2223 is assumed to have a total-bit page data capacity of 24 KB or (3×8 KB).

As illustrated in FIG. 11, the host 2100 is assumed to transfer first data (Data1) having a size of 16 KB to the memory system 2200 during a first programming operation. In response, the controller 2210 partitions the 16 KB of first data according to the 8 KB single-bit capacity of the physical pages 2222 and 2223. Then, separate partitioned first data, each being 8 KB in size, are programmed as single-bit data to the MLC of the physical pages 2222 and 2223 (the first selected physical pages). In the illustrated example, the physical pages have the same single-bit page capacity, but this need not always be the case.

In certain embodiments, the controller 2210 may determine the single bit page capacity for each of the physical pages 2222 and 2223 by reference to meta information characterizing the nonvolatile memory 2200.

Figure 12:
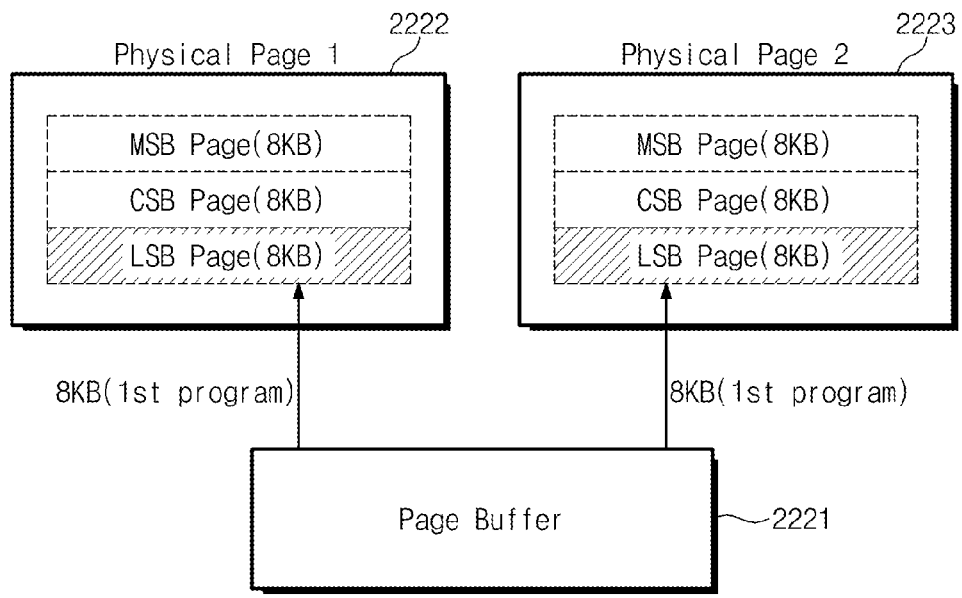
FIG. 12 is a conceptual diagram further illustrating operation of the memory system of FIG. 11.

FIG. 12 is a diagram further illustrating the programing example described in relation to FIG. 11 according to certain embodiments of the inventive concept. Referring to FIG. 12, it is again assumed that each of physical page 2222 and 2223 is defined in relation to multiple logical pages (e.g., a LSB page, a CSB page, and a MSB page).

During the first programming operation, partitioned first data is separately stored in first and second physical pages 2222 and 2223 via a page buffer 2221 using a single bit programming operation.

Thus, during the first programming operation, the partitioned data is stored in the respective LSB pages of the first and second physical pages 2222 and 2223. Since each of the LSB pages of the first and second physical pages 2222 and 2223 has a data capacity of 8 KB, the two sets of partitioned first data having a 8 KB size will completely fill the LSB page of the first and second physical pages 2222 and 2223.

Figure 13:
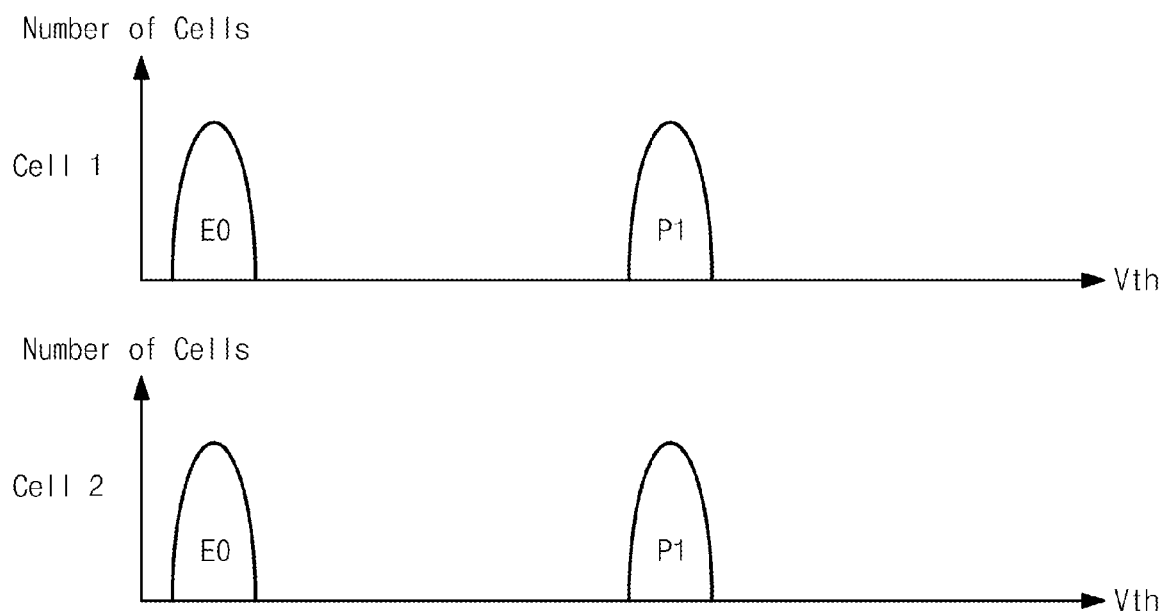
FIG. 13 is a conceptual diagram indicating logical states for memory cells programmed according to single-level memory cell (SLC) programming techniques during the memory system operation of FIGS. 9-12.

FIG. 13 is a conceptual diagram further illustrating the possible results of the first programming operation of FIG. 12. Referring to FIG. 13, the logical state of each MLC in the first physical page in a second physical page following the first programming operation will be an erase state E0 or a programmed state P1.

Figure 14:
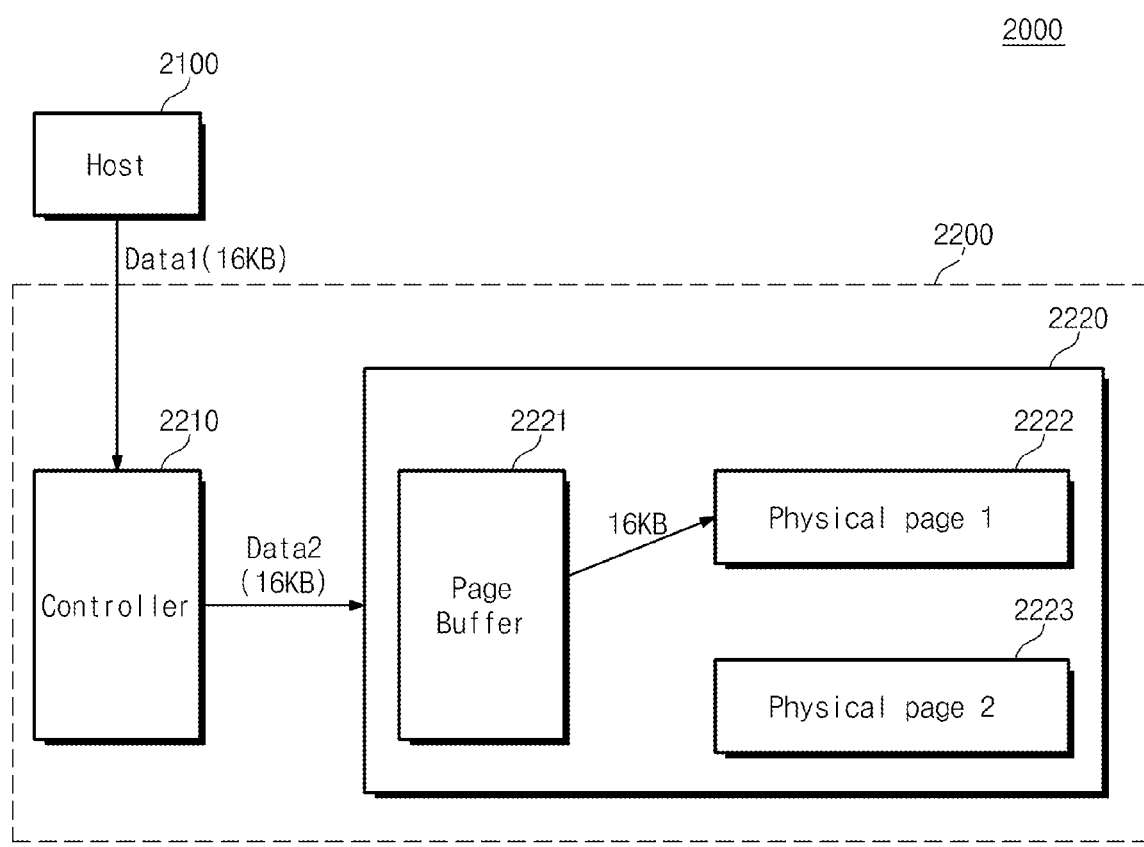
FIGS. 14, 15 and 16 are respective block diagrams further illustrating operation of the memory system of FIGS. 9-12.

FIG. 14 is a diagram extending the description of the programming example of FIGS. 11 through 13.

During a second programming operation following the first programming operation, the host 2100 send second data (Data2) to the memory system 2200. Here again, it is assumed that the size of the second data is 16 KB.

Upon receiving the second data, the controller 2210 compares the size of the second data to the remainder-bit capacity of the physical pages designated as "first selected physical pages" (i.e., physical pages 2222 and 2223 having single-bit data previously stored therein). Since the remainder-bit capacity of each first selected page (2222 and 2223) is 16 KB, only one of the first selected physical pages is needed as a second selected physical page (e.g., physical page 2222).

Accordingly, during the second programming operation, the entire set of second data is stored in the second selected physical page 2222 as multi-bit (e.g., 2-bit) data. Consistent with the foregoing, the second data is programmed in the CSB and MSB pages of the first physical page 2222 during the second programming operation, and no intervening erase operation must be performed on the MLC of the first physical page 2222 between the first and second programming operations. As before, the multi-bit data of the second programming operation will be simultaneously programmed to the CSB and MSB pages of the first physical page 2222.

Figure 15:
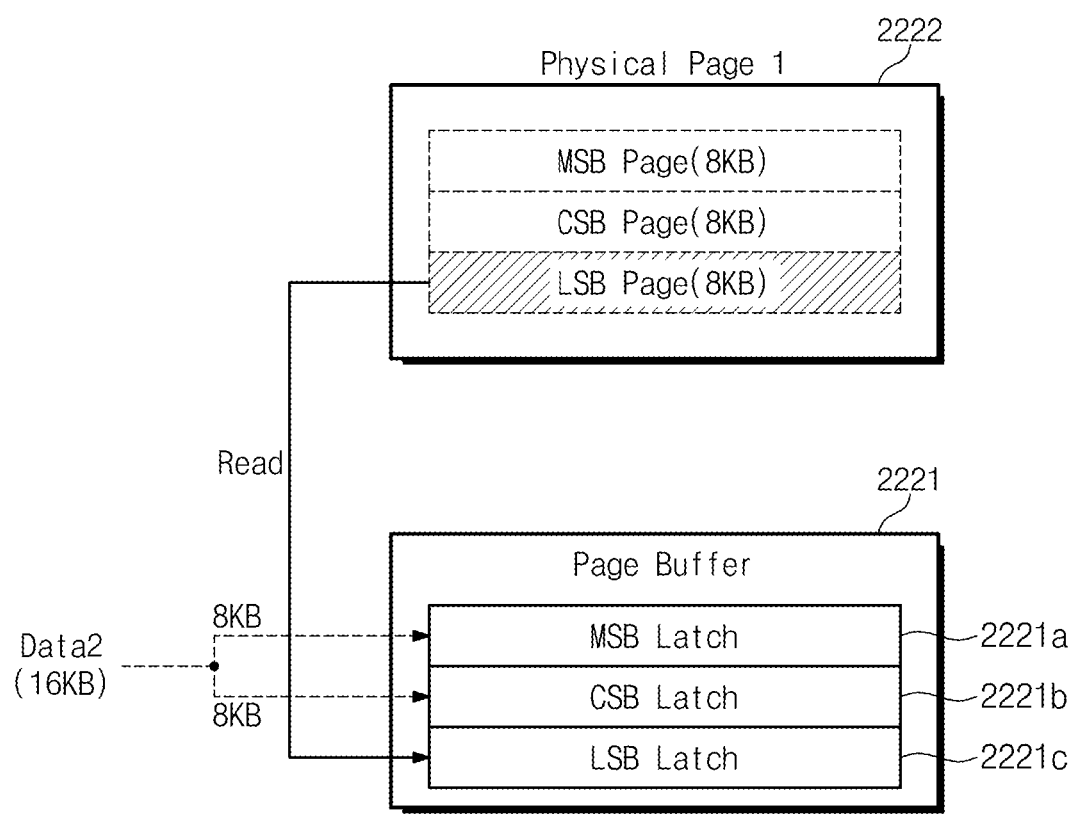
Figure 16:
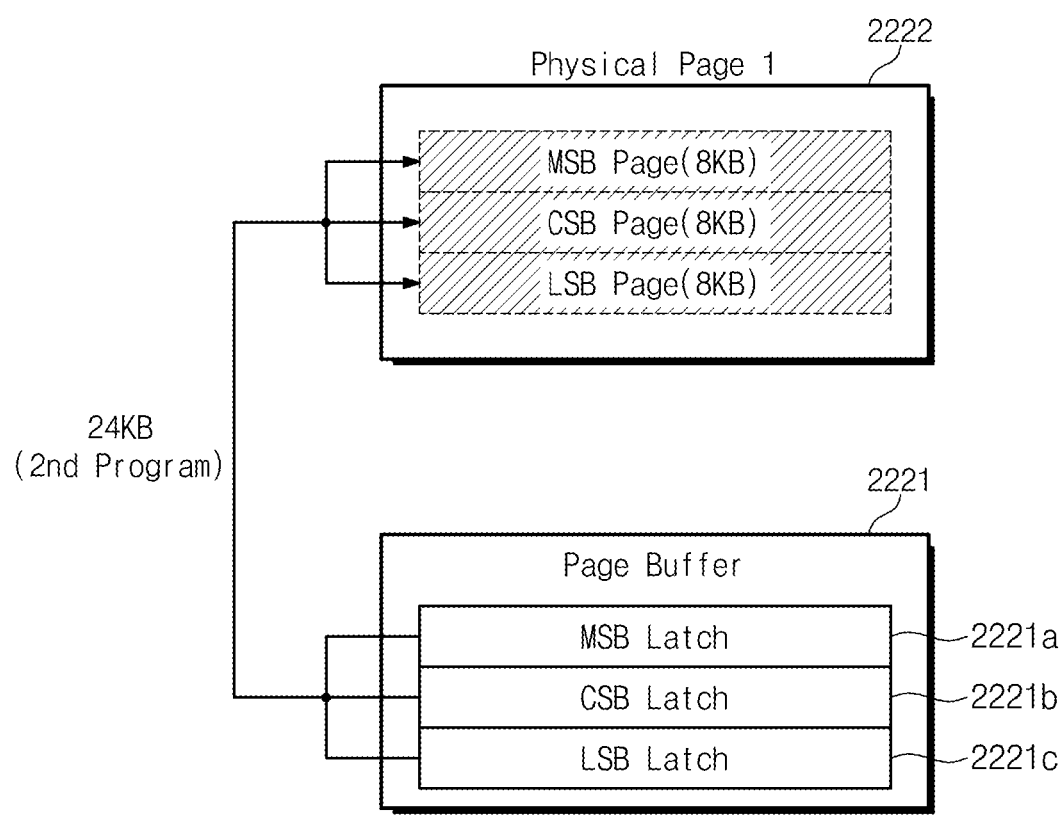

FIGS. 15 and 16 are diagrams still further illustrating the second programming operation of FIGS. 11-14 in the context of certain embodiments of the inventive concept.

Referring to FIG. 15, the first physical page 2222 already stores single-bit LSB page data according to the first programming operation, but the CSB page and MSB page remain unused or "empty" (e.g., have an erase state). During the second programming operation, the second data is transferred from the controller 2210 to the page buffer 2221, wherein the page buffer 2221 is assumed to include a plurality of latches 2221a, 2221b, and 2221c adapted to temporarily store incoming program data.

The page buffer 2221 may read the LSB page stored at the first physical page 2222 and store it at LSB latch 2221c, and the second data (Data2) may be stored at the CSB and MSB latches 2221b and 2221a of the page buffer 2221, respectively.

Referring to FIG. 16, the page buffer 2221 may now program the second data at the first physical page 2222 based on data stored at the plurality of latches 2221a, 2221b, and 2221c during the second programming operation. During the second programming operation, each of the MLC of the physical page 2222 may be programmed to one of eight possible logical states using the 3-bit data (LSB, CSB, and MSB) stored in page buffer 2221, wherein multiple data bits (herein, CSB and MSB data bits) are simultaneously programmed.

In certain embodiments, the second programming operation may be performed using iterative loops defined by an ISPP approach.

Figure 17:
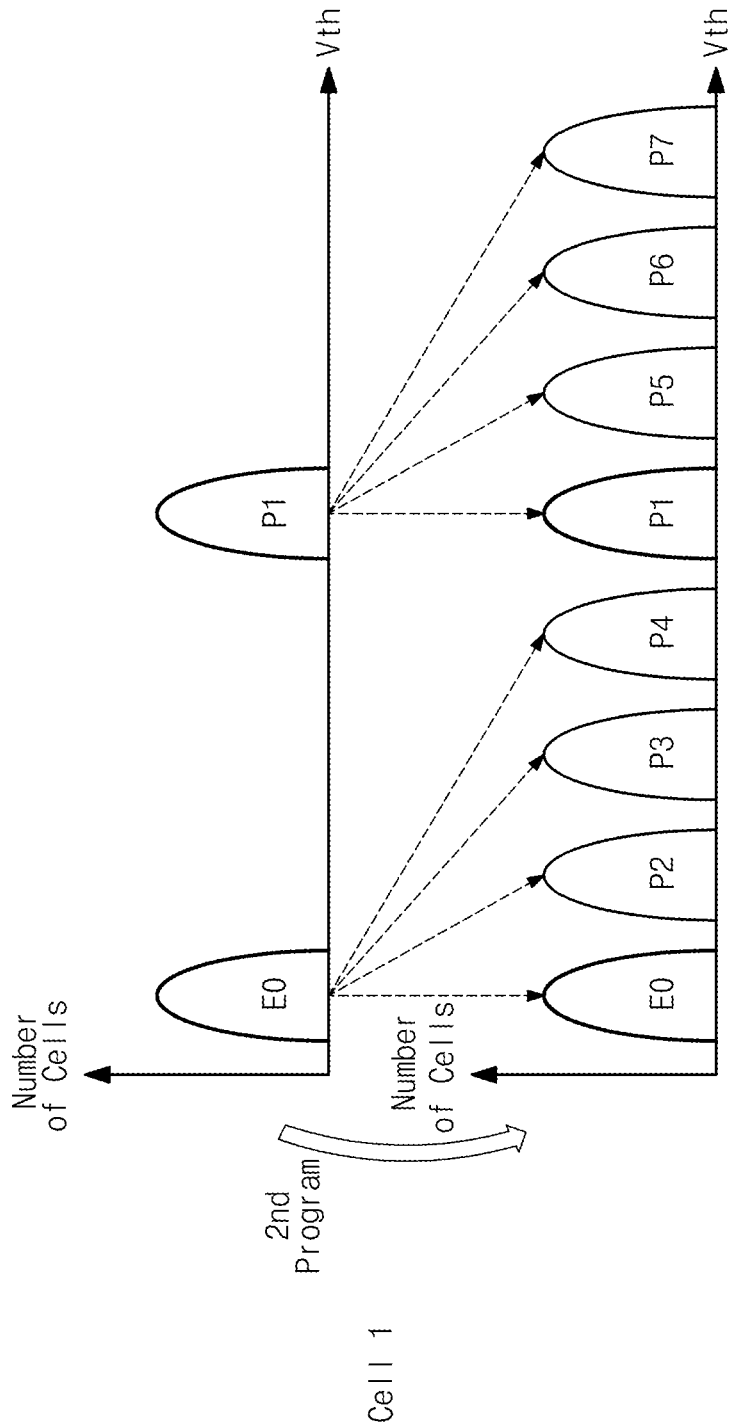
FIG. 17 is a conceptual diagram indicating logical states for memory cells programmed according to multi-level memory cell (MLC) programming techniques during the memory system operation of FIGS. 9-12.

FIG. 17 is a conceptual diagram further illustrating transition between logical states for MLC during the second programming operation. Referring to FIG. 17, there is illustrated a variation in logical states of memory cells included in a first physical page 2222.

Here, a MLC of the first physical page 2222 may store one bit of first data (an erase state E0 or program state P1) following the first programming operation, where the erase state E0 may be associated with a LSB data value of "1", and the program state P1 is associated with a LSB data value of "0".

During the second programming operation, two data bits of the second data are additionally stored in the MLC. Thus, the MLC will be programmed to one of eight possible logical states E0, P1, P2, P3, P4, P5, P6, and P7 respectively corresponding to 3-bit (LSB, CSB and MSB) data values of '110', '101', '011', '100', '010', '001', and '000'.

During the second programming operation, the MLC of the first physical page 2222 are programmed to one of the eight logical states E0, P1, P2, P3, P4, P5, P6, and P7, such that multiple data bits (e.g., the CSB and MSB bits) are simultaneously programmed to the MLC.

Figure 18:
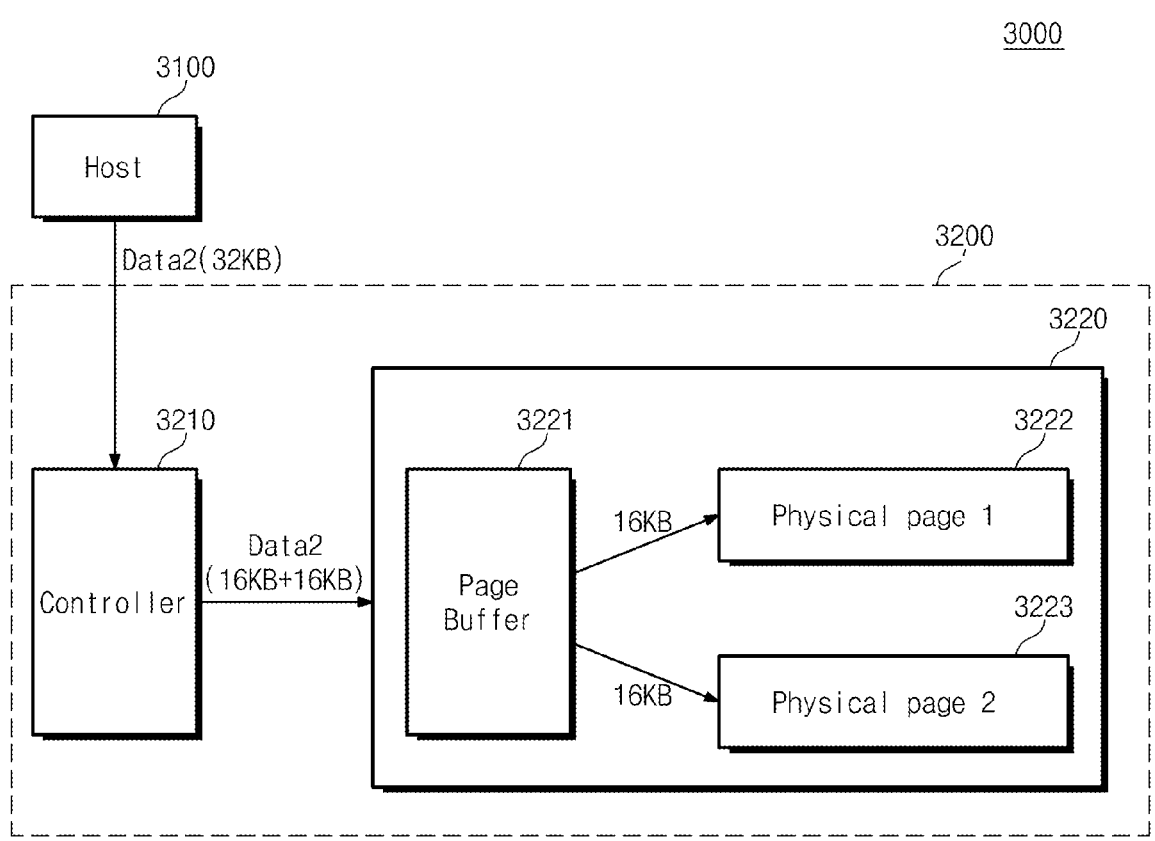
FIG. 18 is a block diagram schematically illustrating operation of a memory system according to an embodiment of the inventive concept.

FIG. 18 is a block diagram still further illustrating another example of the second programming operation of FIGS. 11-14 in the context of certain embodiments of the inventive concept.

Referring to FIG. 18, a user device 3000 comprises a host 3100 and a memory system 3200. The user device 3000 of FIG. 18 may be configured the same as the user device of FIG. 11.

As described above, the memory system 3200 may partition first data provided by the host 3100 and program the partitioned first data across a plurality of first selected physical pages 3222 and 3223. Following the first programming operation, the memory system 3200 may receive second data (Data2) from the host 3100 as part of a second programming operation. Here, however, it is assumed that the second data Data2 has a size of 32 KB.

Accordingly, the controller 3210 divides the second data using a remainder-bit page capacity of the first selected physical pages to determine a number of second selected physical pages among the first selected physical pages. As in FIG. 11, it is assumed that the total-bit page capacity of the first selected physical pages 3222 and 3223 is 24 KB. Thus, in view of the 8 KB single-bit page capacity, it is assumed that the remainder-bit page capacity of the first selected physical pages 3222 and 3223 is 16 KB.

Since the size of the second data is 32 KB both of the first selected physical pages 3222 and 3223 are designated as second selected physical pages and each is used to store 16 KB of the second data. In illustrated example it is assumed that the controller 3210 divides the second data (Data2) into the two sets of divided second data. Thereafter, the page buffer 3221 may sequentially or simultaneously program the second selected physical pages 3222 and 3223.

In certain embodiments, the nonvolatile memory 3220 may select the second selected physical pages suing a string selection line. That is, the second selected physical pages 3222 and 3223 may be physical pages connected by a common selection line. However, in other embodiments, the second selected physical pages 3222 and 3223 may be physical pages connected to different string selection lines.

The controller 3210 controls the nonvolatile memory 3220 such that two sets of 16 KB second data are programmed to the second selected physical pages 3222 and 3223, respectively. The controller 3210 will simultaneously program multi-bit data in a plurality of logical pages within each of the second selected physical pages 3222 and 3223.

Figure 19:
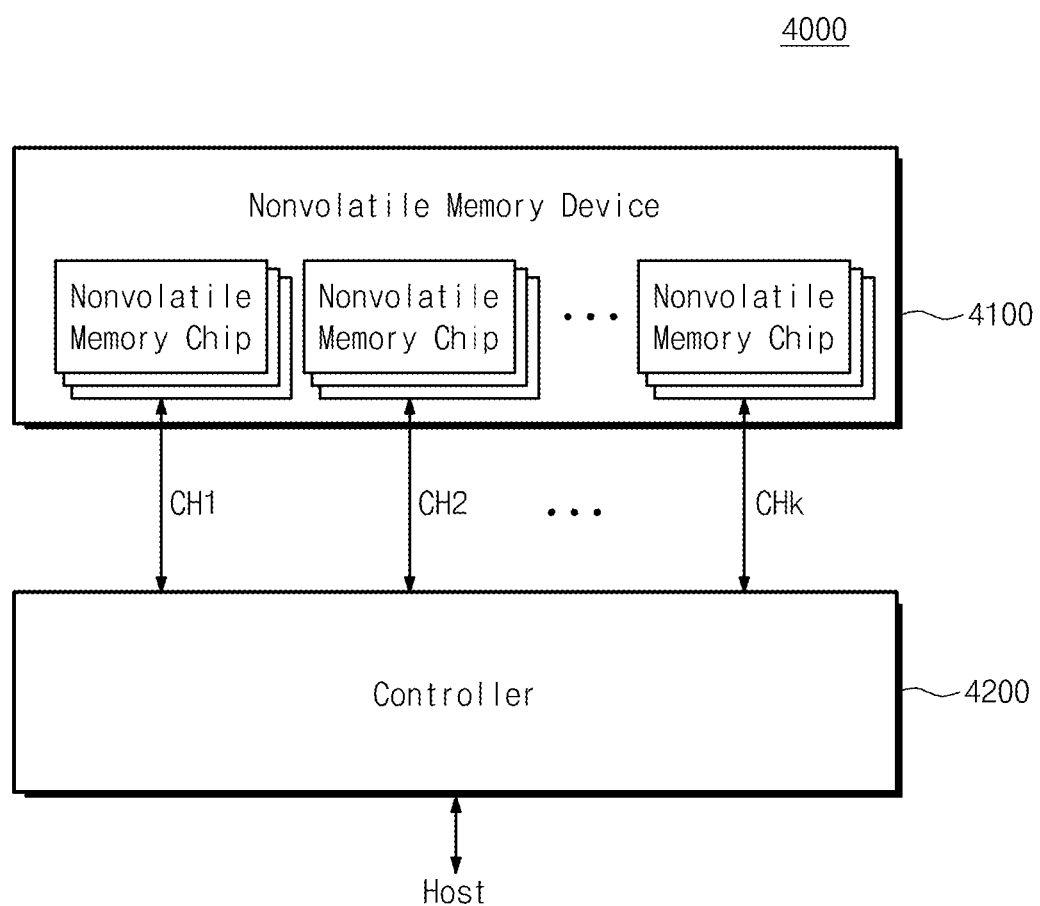
FIG. 19 is a block diagram illustrating a memory system according to another embodiment of the inventive concept.

FIG. 19 is a block diagram illustrating a memory system according to another embodiment of the inventive concept. Referring to FIG. 19, a memory system 4000 comprises a nonvolatile memory device 4100 and a controller 4200. The nonvolatile memory device 4100 includes a plurality of nonvolatile memory chips, which form a plurality of groups. Nonvolatile memory chips in each group may be configured to communicate with the controller 4200 via one common channel. In the illustrated embodiment, the plurality of nonvolatile memory chips communicate with the controller 4200 via a plurality of channels CH1 to CHk.

Each of the nonvolatile memory chips may be configured the same as a nonvolatile memory device 100 according to an embodiment of the inventive concept. That is, the nonvolatile memory device 4100 may include (per FIG. 4) a plurality of cell strings CS11, CS12, CS21, and CS22 provided on a substrate 111, and each of the cell strings CS11, CS12, CS21, and CS22 may include a plurality of cell transistors stacked in a direction perpendicular to the substrate 111.

In FIG. 19, there is described a case wherein one channel is connected with a plurality of nonvolatile memory chips. However, the memory system 4000 can be modified such that one channel is connected with only one nonvolatile memory chip.

The nonvolatile memory device 4100 and the controller 4200 may be substantially similar to nonvolatile memory device and controller of FIG. 2, except that the controller 4200 communicates with the plurality of nonvolatile memory chips via the common channel.

Figure 20:
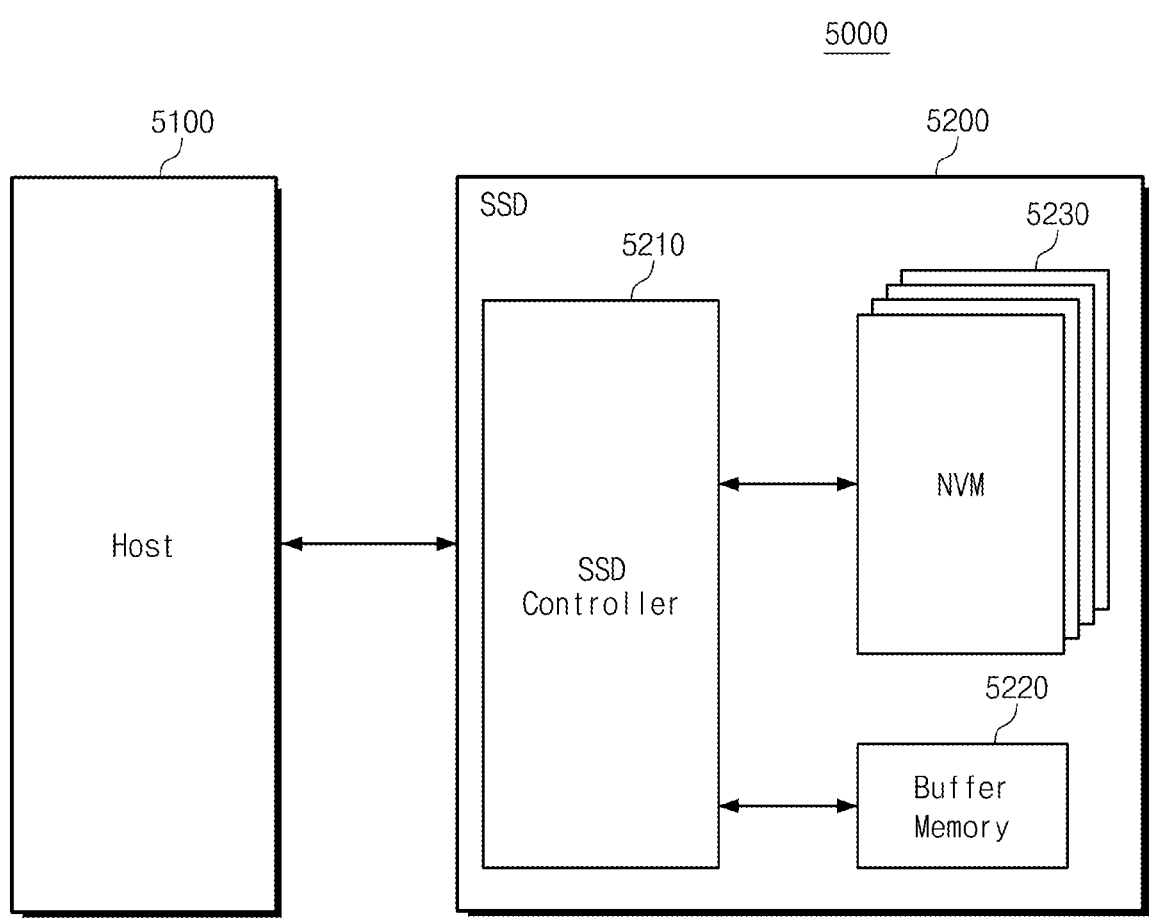
FIG. 20 is a block diagram illustrating a solid state drive (SDD) according to an embodiment of the inventive concept.

FIG. 20 is a block diagram illustrating a solid state drive (SSD) according to an embodiment of the inventive concept. Referring to FIG. 20, a user device 5000 comprises a host 5100 and a SSD 5200. The SSD 5200 includes an SSD controller 5210, a buffer memory 5220, and a nonvolatile memory device 5230.

The SSD controller 5210 may provide physical interconnection between the host 5100 and the SSD 5200. The SSD controller 5210 may provide an interface with the SSD 5200 corresponding to a bus format of the host 5100. In particular, the SSD controller 5210 may decode a command provided from the host 5100 to access the nonvolatile memory device 5230 based on the decoding result.

The SSD controller 5210 may be connected with the host 5100 and the nonvolatile memory device 5230. The SSD controller 5210 may be configured to access the nonvolatile memory device 5230 in response to a request from the host 5100. The SSD controller 5210 may provide an interface between the host 510 and the nonvolatile memory device 5230. The SSD controller 5210 may be configured to drive firmware for controlling the nonvolatile memory device 5230. The SSD controller 5210 may be configured to provide a control signal CTRL, a command CMD, and an address ADDR to the nonvolatile memory device 5230.

The SSD controller 5210 may be used to partition first data received from the host 5100 to store the partitioned first data across a plurality of first selected physical pages of the nonvolatile memory device 5230 as single-bit data during the first programming operation. This may be performed substantially the same as a first programming operation in which a controller 3210 (refer to FIG. 11) stores partitioned first data.

Following the first programming operation, the SSD controller 5210 may receive second data from the host 5100. The SSD controller 5210 may control the nonvolatile memory device 5230 such that the second data is programmed in at least one of a plurality of first selected physical pages as multi-bit data during the second programming operation. The second programming operation may be performed consistent with the description provided with reference to FIG. 9.

The bus format of the host 5100 may include USB (Universal Serial Bus), SCSI (Small Computer System Interface), PCI express, ATA, PATA (Parallel ATA), SATA (Serial ATA), SAS (Serial Attached SCSI), and the like.

The buffer memory 5220 may temporarily store write data provided from the host 5100 or data read out from the nonvolatile memory device 5230. In the event that data existing in the nonvolatile memory device 5230 is cached, at a read request of the host 5100, the buffer memory 5220 may support a cache function to provide cached data directly to the host 5100. Generally, a data transfer speed of a bus format (e.g., SATA or SAS) of the host 5100 may be higher than that of a memory channel of the SSD 5200. That is, in the event that an interface speed of the host 5100 is remarkably fast, lowering of the performance due to a speed difference may be minimized by providing the buffer memory 5220 having a large storage capacity.

The buffer memory 5220 may be formed of a synchronous DRAM to provide sufficient buffering to the SSD 5200 used as an auxiliary mass storage device. However, the buffer memory 5220 is not limited to this disclosure.

The nonvolatile memory device 5230 may be provided as a storage medium of the SSD 5200. For example, the nonvolatile memory device 5230 may be formed of a NAND flash memory device having a mass storage capacity. The nonvolatile memory device 5230 may be formed of a plurality of memory devices. In this case, the memory devices may be connected to the SSD controller 5210 by a channel unit, respectively. As a storage medium, the nonvolatile memory device 5230 may be formed of a NAND flash memory. However, the nonvolatile memory device 5230 is not limited to a NAND flash memory device. For example, a storage medium of the SSD 5200 can be formed of a PRAM, an MRAM, a ReRAM, a FRAM, a NOR flash memory, and the like. Further, the inventive concept may be applied to a memory system which uses different types of memory devices together.

The nonvolatile memory device 5230 may be configured substantially the same as the nonvolatile memory device described in the context of FIGS. 1 and 2.

Figure 21:
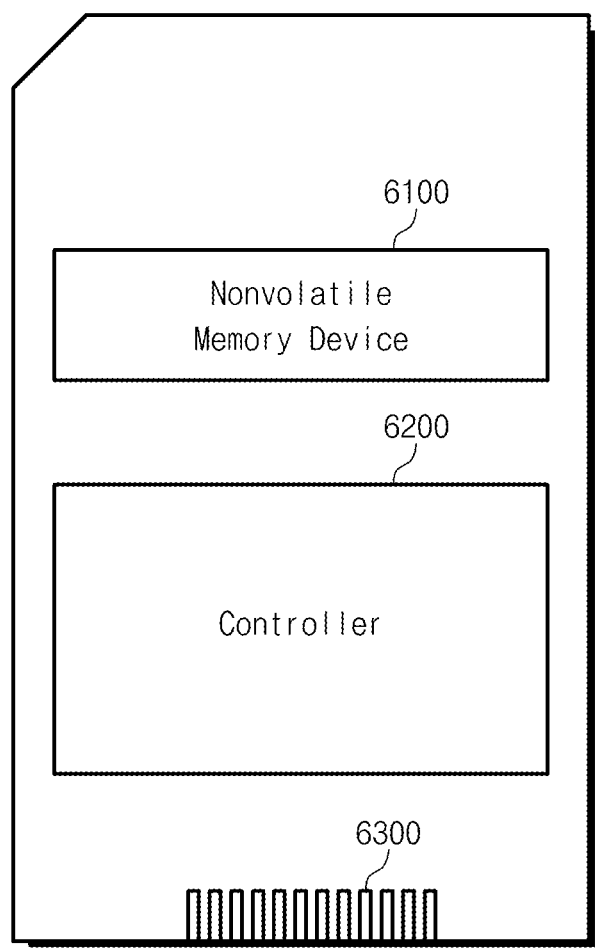
FIG. 21 is a diagram illustrating a memory card according to an embodiment of the inventive concept.

FIG. 21 is a diagram illustrating a memory card according to an embodiment of the inventive concept. Referring to FIG. 21, a memory card 6000 comprises a nonvolatile memory device 6100, a controller 6200, and a connector 6300.

The nonvolatile memory device 6100 may be configured the same as a nonvolatile memory device 100 of FIG. 1 according to certain embodiments of the inventive concept. That is, the nonvolatile memory device 6100 may include (per FIGS. 4 and 5) a plurality of cell strings CS11, CS12, CS21, and CS22 provided on a substrate 111, and each of the cell strings CS11, CS12, CS21, and CS22 may include a plurality of cell transistors stacked in a direction perpendicular to the substrate 111.

The controller 6200 may be connected with the nonvolatile memory device 6100. The controller 6200 may be configured to access the nonvolatile memory device 6100. The controller 6200 may be configured to provide the nonvolatile memory device 6100 with an interface. The controller 6200 may be configured to provide the nonvolatile memory device 6100 with a control signal CTRL, a command CMD, and an address ADDR.

The connector 6300 may connect the memory card 6000 with a host electrically.

The controller 6200 may be used to partition first data received from the host through the connector 6300 and store the partitioned first data across a plurality of physical pages of the nonvolatile memory device 6100 during the first programming operation. This may be performed substantially the same as a first programming operation performed by the controller 3210 of FIG. 11.

Following the first programming operation, the controller 6200 may receive second data from the host. The controller 6200 may control the nonvolatile memory device 6100 such that the second data is programmed in at least one of a plurality of physical pages at which the first data was programmed during a second programming operation. The second programming operation may be performed as described with reference to FIG. 9.

The memory card 6000 may be formed of memory cards such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, and the like.

Figure 22:
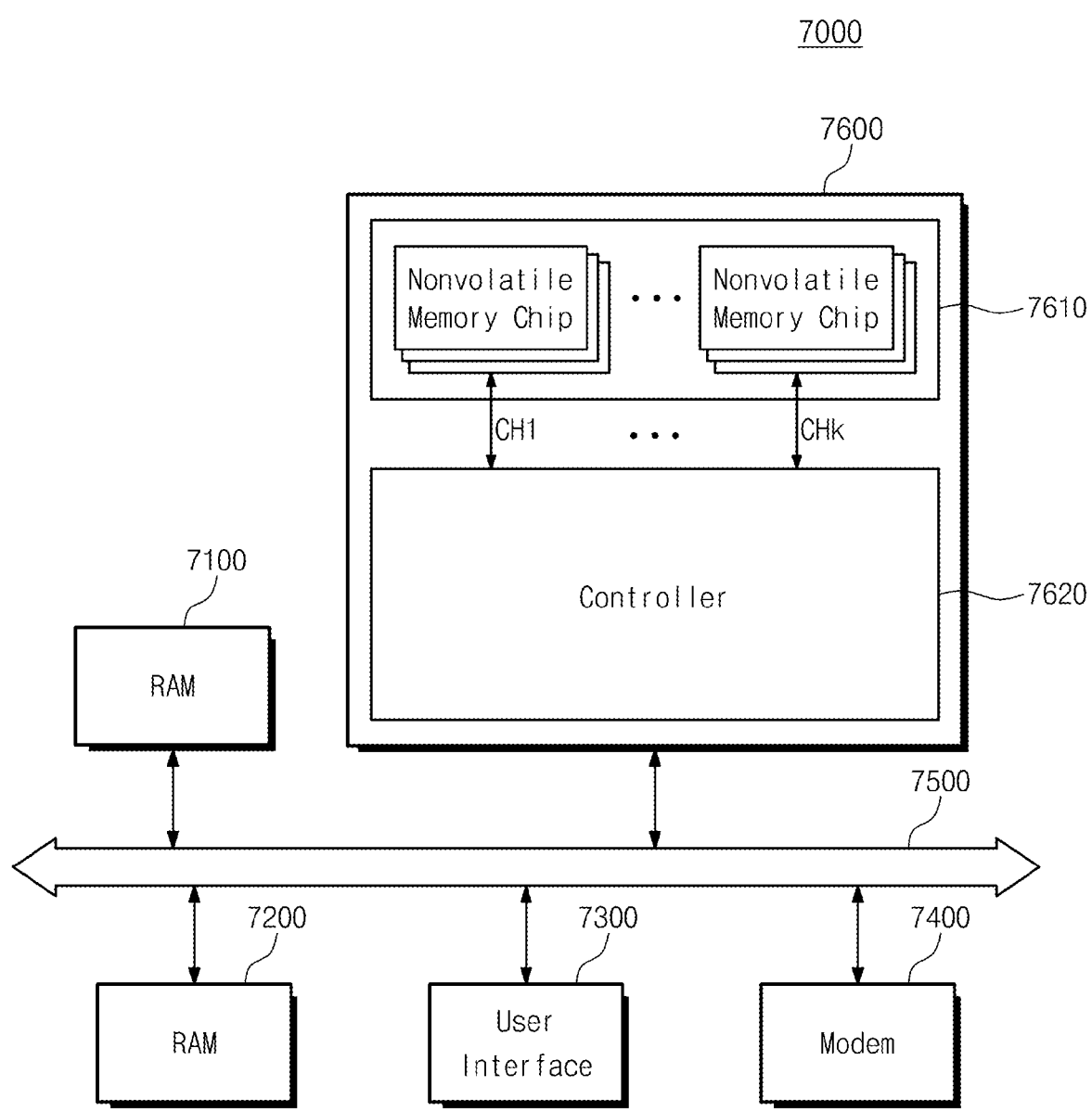
FIG. 22 is a block diagram illustrating a computational system according to an embodiment of the inventive concept.

FIG. 22 is a block diagram illustrating a computational system according to an embodiment of the inventive concept. Referring to FIG. 22, a computational system 7000 comprises a central processing unit 7100, a RAM 7200, a user interface 7300, a modem 7400, a system bus 7500, and a memory system 7600.

The memory system 7600 may be connected electrically with the elements 7100 to 7400 via the system bus 7500. Data provided via the user interface 7300 or processed by the central processing unit 7100 may be stored in the memory system 7600.

The memory system 7600 may include a nonvolatile memory device 7610 and a controller 7620. The memory system 7600 may be one of memory systems 1000 to 4000 according to embodiments of the inventive concept, a memory card 600, and a solid state drive 500.

While the inventive concept has been described with reference to exemplary embodiments, it will be apparent to those skilled in the art that various changes and modifications may be made without departing from the scope of the following claims. Therefore, it should be understood that the above embodiments are not limiting, but illustrative.

What is claimed is:

1. A programming method for a non-volatile memory, the method comprising:
receiving first data and partitioning the first data according to physical pages of memory cells of a memory cell array to generate partitioned first data, the physical pages corresponding to memory cells connected to respective word lines of the memory cell array, the memory cells each for storing N bits of data, where N is an integer of 3 or more, and the N bits including a least significant bit (LSB), at least one central significant bit (CSB) and a most significant bit (MSB);
programming the partitioned first data as LSB page data to the plurality of physical pages, respectively; and
receiving second data; and
programming the second data as CSB and MSB page data to a selected physical page among the plurality of physical pages to which the first data is programmed as LSB page data, wherein the second data is simultaneously programmed to the memory cells of the selected physical page.

2. The method of claim 1, wherein the partitioned first data is programmed in plural LSB logical pages of the respective plurality of physical pages.

3. The method of claim 2, wherein the second data is programmed in at least one CSB logical page and an MSB logical page of only the selected physical page, and
wherein a data size of the first data is the same as a data size of the second data.

4. The method of claim 1, wherein the memory cell array is a three-dimensional (3D) memory cell array comprising:
a plurality of cells strings, each cell string extending in a first direction; and
a plurality of bit lines extending in a third direction, the plurality of word lines extending in a second direction.

5. The method of claim 4, wherein the memory cells of each one of the plurality of physical pages are commonly controlled by one of the plurality of word lines, and commonly disposed at a same height within the 3D memory cell array.

6. The method of claim 4, wherein each cell string is connected to one of the plurality of bit lines and comprises a plurality of memory cells arranged in series between a string selection transistor (SST) and a ground selection transistor (GST),
each one of the plurality of plurality of memory cells being respectively controlled by one of the plurality of word lines, each SST being controlled by a string selection line, and each GST being controlled by a ground selection line.

7. The method of claim 6, wherein each one of the plurality of physical pages is selected by one string selection line.

8. The method of claim 4, wherein each of the MLC is a charge trap flash (CTF) memory cell.

9. The method of claim 1, wherein the programming of the second data as CSB and MSB page data to the selected physical page includes incremental step pulse programming.

10. The method of claim 1, wherein the programming of the partitioned first data as LSB page data to the plurality of physical pages, respectively, and the programming of the second data as CSB and MSB page data to the selected physical page are carried out without an intervening erase operation being performed on the selected physical page.

11. A data management method for a memory system including a non-volatile memory having a memory cell array of memory cells arranged in physical pages, wherein each memory cell stores up to N bits of data, each physical page is defined by a single-bit page capacity (1bPC), a total-bit page capacity (TbPC) equal to (N×1PC), and a remainder-bit page capacity (RbPC) equal to (TbPC−1bPC), the method comprising:
executing a first programming operation storing X bits of first data by:

determining a number Q of first selected physical pages necessary to store the first data as single bit data in the first selected physical pages, where Q=[(X÷1bPC)+1 for any remainder];

partitioning the first data by Q to generate partitioned first data; and programming the partitioned first data as single-bit data to the first selected physical pages; and executing a second programming operation storing Y bits of second data after executing the first programming operation by:

determining a number R of second selected physical pages among the first selected physical pages necessary to store the second data as (N−1) multi-bit data in the second selected physical pages, where R=[(Y÷RbPC)+1 for any remainder];

dividing the second data by R to generate divided second data; and programming the divided second data as (N−1) multi-bit data to the second selected physical pages, wherein the divided second data is simultaneously programmed to memory cells of the second selected physical pages, where "N" is an integer greater than 2, "Q" is an integer greater than 1, and each one of "X", "Y", and "R" is a positive integer.

12. The method of claim 11, wherein all of the second selected physical pages are programmed together during the second programming operation.

13. The method of claim 11, wherein R is greater than 1, and each one of the second selected physical pages is sequentially programmed during the second programming operation.

14. The method of claim 11, where N is 3, and the partitioned first data is stored in a first logical page of the first selected physical pages as least significant bit (LSB) data.

15. The method of claim 14, wherein for each one of the second selected physical pages, the divided second data is simultaneously programmed to a second logical page as central significant bit (CSB) data, and to a third logical page as most significant bit (MSB) data.

16. The method of claim 11, wherein at least one of the first programming operation and the second programming operation uses incremental step pulse programming (ISPP).

17. The method of claim 11, wherein the memory system comprises a memory controller that receives and partitions the first data during the first programming operation, and receives and divides the second data during the second programming operation.

18. The method of claim 11, wherein the memory cell array is a three-dimensional (3D) memory cell array.

19. The method of claim 18, wherein the memory cells of multiple physical pages are commonly controlled by one of a plurality of word lines traversing the 3D memory cell array and commonly disposed at a same height within the 3D memory cell array.

20. The method of claim 19, wherein each physical page may be selected from among the multiple physical pages using a string selection line traversing the 3D memory cell array.

21. A data management method for a non-volatile memory including a memory cell array of memory cells arranged in physical pages, the method comprising:

executing a first programming operation including:
receiving first data,
partitioning the first data according to physical pages of a memory cell array to generate partitioned first data, the physical pages corresponding to memory cells connected to respective word lines of the memory cell array, and each physical page including a least significant bit (LSB) logical page, at least one central significant bit (CSB) logical page, and a most significant bit (MSB) logical page; and
programming the partitioned first data to only the LSB logical page of each of a plurality of the physical pages of the memory cells of the memory cell array; and executing a second programming operation performed after the first programming operation, including:
receiving second data, and
simultaneously programming the second data to only the at least one CSB logical page and the MSB logic page of at least one of the at least one selected physical page among the plurality of physical pages to which the first data is programmed.

22. The method of claim 21, wherein each first data is programmed to the first logical page using one of an erase threshold voltage distribution indicating an erase state and a first threshold voltage distribution indicating a first programmed state.

23. The method of claim 22, wherein each second data is programmed by:
(a) retaining the erase threshold voltage distribution;
(b) transitioning from the erase threshold voltage distribution to one of second, third and fourth threshold voltage distributions respectively indicating second, third and fourth programmed states;
(c) retaining the first threshold voltage distribution; or
(d) transitioning from the first threshold voltage distribution to one of fifth, sixth and seventh threshold voltage distributions respectively indicating fifth, sixth and seventh programmed states.

* * * * *